United States Patent
Krabbenborg

(10) Patent No.: US 10,432,087 B2
(45) Date of Patent: Oct. 1, 2019

(54) CIRCUIT FOR A SWITCHED MODE POWER SUPPLY

(71) Applicant: NXP B.V., Eindhoven (NL)

(72) Inventor: Benno Krabbenborg, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/144,004

(22) Filed: Sep. 27, 2018

(65) Prior Publication Data
US 2019/0131871 A1 May 2, 2019

(30) Foreign Application Priority Data
Nov. 1, 2017 (EP) .................................... 17199564

(51) Int. Cl.
| | |
|---|---|
| *H02M 3/156* | (2006.01) |
| *H02M 1/40* | (2007.01) |
| *H03F 3/45* | (2006.01) |
| *G05F 1/10* | (2006.01) |
| *H02M 1/00* | (2006.01) |

(52) U.S. Cl.
CPC .............. *H02M 3/156* (2013.01); *G05F 1/10* (2013.01); *H02M 1/40* (2013.01); *H03F 3/45071* (2013.01); *H02M 2001/0006* (2013.01); *H02M 2001/0009* (2013.01); *H02M 2001/0025* (2013.01)

(58) Field of Classification Search
None
See application file for complete search history.

(56) References Cited

U.S. PATENT DOCUMENTS

| 5,943,229 A | 8/1999 | Sudhoff | |
|---|---|---|---|
| 7,518,348 B1* | 4/2009 | Kobayashi | ............ H02M 3/156 323/222 |

(Continued)

OTHER PUBLICATIONS

Borowy, Bogdan S. et al; "Pulse-by-Pulse Predictive Current Limiter"; IEEE Applied Power Electronics Conference and Exposition; 7 pages (2006).

(Continued)

*Primary Examiner* — Jeffrey A Gblende

(57) ABSTRACT

A circuit for a switched-mode-power-supply. The switched-mode-power-supply is configured to: receive a current-control-signal; and provide an output-voltage based on the current-control-signal. The circuit comprises a controller, a current-limiter and a clamp-circuit. The controller is configured to: generate a control-voltage based on the difference between: (i) a sense-voltage, which is representative of the output-voltage of the switched-mode-power-supply; and (ii) a reference-voltage; generate a target-current-control-signal based on the control-voltage, wherein the target-current-control-signal is configured to adjust the current through the switched-mode-power-supply in order to bring the sense-voltage closer to the reference-voltage. The current-limiter is configured to provide the current-control-signal as the target-current-control-signal limited to a max-current-control-value. The clamp-circuit is configured to set the control-voltage to a clamp-voltage-value when the current-limiter provides the current-control-signal having the limited value of the max-current-control-value.

16 Claims, 15 Drawing Sheets

(56) References Cited

U.S. PATENT DOCUMENTS

| | | | |
|---|---|---|---|
| 8,004,256 B2 | 8/2011 | Tabata et al. | |
| 8,421,432 B2* | 4/2013 | Hawkes | H02M 3/156 323/283 |
| 9,098,103 B1 | 8/2015 | Milanesi | |
| 9,641,081 B2 | 5/2017 | Krabbenborg | |
| 2008/0068866 A1 | 3/2008 | Blanken | |
| 2009/0102445 A1* | 4/2009 | Ito | H02M 3/156 323/283 |
| 2016/0190922 A1* | 6/2016 | Malinin | H02M 3/156 323/271 |
| 2017/0194858 A1* | 7/2017 | Villot | H02M 3/156 |
| 2018/0374705 A1* | 12/2018 | Dhanasekaran | H01L 21/265 |

OTHER PUBLICATIONS

Dening, David; "A Buck-or-Boost Converter Module with Embedded Inductor and Fast Current Limit"; IEEE Transactions on Power Electronics, vol. 26, No. 12; pp. 3874-3883 (Dec. 2011).

Hafiz, Mohiuddin et al; "A Very Low Voltage High Duty Cycle Step-up Regulator"; International Conference on Electrical and Computer Engineering, Dhaka, Bangledesh; pp. 506-511 (Dec. 2008).

Hsieh, Chun-Yu et al; "A Novel Precise Step-Shaped Soft-Start Technique for Integrated DC-DC Converter"; IEEE International Conference on Electronics, Circuits and Systems; pp. 771-774 (2007).

Suryanarayana, H. et al; "Average-Value Modeling of a Peak-Current Controlled Galvanically-Isolated DC-DC Converter for Shipboard Power Distribution"; IEEE Electric Ship Technologies; pp. 152-161 (Apr. 22, 2013).

Visioli, A; "Modified Anti-Windup Scheme for PID Controllers"; IEEE Proceedings D. Control Theory & Applicati, Institute of Electrical Engineers, Stevenage, GB, vol. 150, No. 1; pp. 49-54 (Jan. 24, 2003).

\* cited by examiner

CIRCUIT FOR A SWITCHED MODE POWER SUPPLY

CROSS-REFERENCE TO RELATED APPLICATIONS

This application claims the priority under 35 U.S.C. § 119 of European patent application no. 17199564.0, filed Nov. 1, 2017 the contents of which are incorporated by reference herein.

The present disclosure relates to circuits for switched-mode-power-supplies, and in particular to circuits that have a controller, a current-limiter and a clamp-circuit.

According to a first aspect of the present disclosure there is provided a circuit for a switched-mode-power-supply, wherein the switched-mode-power-supply is configured to: receive a current-control-signal; and provide an output-voltage based on the current-control-signal, the circuit comprising:
  a controller, configured to:
    generate a control-voltage based on the difference between: (i) a sense-voltage, which is representative of the output-voltage of the switched-mode-power-supply; and (ii) a reference-voltage;
    generate a target-current-control-signal based on the control-voltage, wherein the target-current-control-signal is configured to adjust the current through the switched-mode-power-supply in order to bring the sense-voltage closer to the reference-voltage;
  a current-limiter configured to provide the current-control-signal as the target-current-control-signal limited to a max-current-control-value; and
  a clamp-circuit configured to set the control-voltage to a clamp-voltage-value when the current-limiter provides the current-control-signal having the limited value of the max-current-control-value.

The clamp-circuit can advantageously prevent or reduce drift of the control-voltage when current limiting is used. In this way the control-voltage may not leave a normal operating region, and normal operation can be resumed more quickly when a load subsequently reduces to a lower level that does not require current limiting. This can beneficially reduce the overshoot on the output-voltage to a level that would occur without current limiting.

In one or more embodiments, the clamp-circuit comprises a voltage regulator. The voltage regulator may be configured to regulate the control-voltage to the clamp-voltage-value for all values of the sense-voltage and the reference-voltage that would cause the target-current-control-signal to be set to a value that is equal to or greater than the max-current-control-value.

In one or more embodiments, the controller comprises a transconductance-amplifier-control-block, which may incorporate the functionality of the current-limiter and the clamp-circuit. The transconductance-amplifier-control-block may be configured to: receive the control-voltage; prevent the control-voltage from increasing when the current-control-signal has the limited value of the max-current-control-value; and convert the control-voltage to the current-control-signal.

In one or more embodiments, the transconductance-amplifier-control-block comprises one or more of: a voltage amplifier, a bias-voltage-source configured to provide a saturation-voltage; a clamp-transistor; and a first-mirror-second-transistor. The voltage amplifier in combination with the clamp-transistor may be configured to regulate the voltage drop across the first-mirror-second-transistor to the saturation-voltage provided by the bias-voltage-source.

In one or more embodiments, the transconductance-amplifier-control-block comprises a transistor, and optionally the transconductance-amplifier-control-block is configured to prevent the control-voltage from increasing when the voltage drop across the transistor exceeds a saturation-voltage of the transistor.

In one or more embodiments, the saturation-voltage is representative of the transistor being in a saturated state of operation.

In one or more embodiments, the transconductance-amplifier-control-block is configured prevent the control-voltage from increasing when a transistor in the transconductance-amplifier-control-block is in saturation.

In one or more embodiments, the controller comprises: a transconductance-amplifier-control-block, which may incorporate the functionality of the current-limiter and the clamp-circuit. The transconductance-amplifier-control-block may be configured to: receive the control-voltage; provide a non-zero over-current-signal when the current-control-signal has the limited value of max-current-control-value, wherein the over-current-signal may be configured to change the sense-voltage independently of the current through the switched-mode-power-supply; and convert the control-voltage to the current-control-signal.

In one or more embodiments, the switched-mode-power-supply includes a target-output-voltage, which may define a set-point for the switched-mode-power-supply, and the over-current-signal is configured to change the target-output-voltage to a level such that the current through the switched-mode-power-supply corresponds to the max-current-control-value.

In one or more embodiments, the clamp-voltage-value is a value of the control-voltage before the current-limiter provides the current-control-signal with the limited value of the max-current-control-value.

In one or more embodiments, the clamp-circuit is configured to clamp the control-voltage to its current value when the current-limiter provides the current-control-signal with the limited value of the max-current-control-value.

In one or more embodiments, the controller is configured to generate the control-voltage by integrating the difference between: (i) the sense-voltage; and (ii) the reference-voltage.

In one or more embodiments, the target-current-control-signal is configured to adjust the current through the switched-mode-power-supply by setting the peak current through an inductor in the switched-mode-power-supply.

In one or more embodiments, the clamp-circuit is configured to provide a flag-signal that is representative of whether or not the control-voltage is set to the clamp-voltage-value. The circuit may comprise a controllable-block that is configured to be automatically contrasted based on the flag-signal.

In one or more embodiments, the switched-mode-power-supply comprises a buck converter, a buck-boost converter or a flyback converter.

There may be provided an audio amplifier circuit comprising:
  any circuit disclosed herein, wherein the clamp-circuit is configured to provide a flag-signal that is representative of whether or not the control-voltage is set to the clamp-voltage-value; and
  a controllable-block that is configured to be automatically controlled based on the flag-signal.

In one or more embodiments, the controllable-block comprises an amplifier. The amplifier may be configured to automatically control an audio level of an output signal of the audio amplifier circuit based on the flag-signal.

While the disclosure is amenable to various modifications and alternative forms, specifics thereof have been shown by way of example in the drawings and will be described in detail.

It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

In modern battery operated portable electronic equipment, such as smart phones, high efficiency boost converters are used for circuits that require a voltage above the battery voltage. In a boost converter, a controller is used to regulate the boost voltage to the required level. The amount of overshoot or undershoot on this boost voltage after a load step is an important performance indicator for the speed and quality of the controller. If the load or the converter itself has a maximum voltage, any overshoot can decrease the margin between maximum and nominal boost voltage.

In a boost converter, a limitation on the coil/inductor current can be implemented to prevent inductor saturation, excessive battery currents, or damage in the circuit itself. When current limitation is active, for example for heavy loads, the target boost voltage can no longer be reached and the controller is no longer able to control the boost voltage. There can be a large error voltage on the input of the controller in this situation. Controllers can have an integrating function for high boost voltage accuracy, in which case the integrated error voltage will drift away when current limiting is occurring. When the heavy load is no longer present, the current will stay at the maximum level until the boost voltage is back at the target level. Then the recovery starts, the error voltage changes sign and the integrated error voltage will decrease back to normal operating level. The amount of drift will determine how much time this recovery takes. This can lead to a much higher boost voltage overshoot than in the case of a load step under non-limited current levels. The longer the recovery takes, the higher the overshoot on the boost voltage will be.

Figure 1:
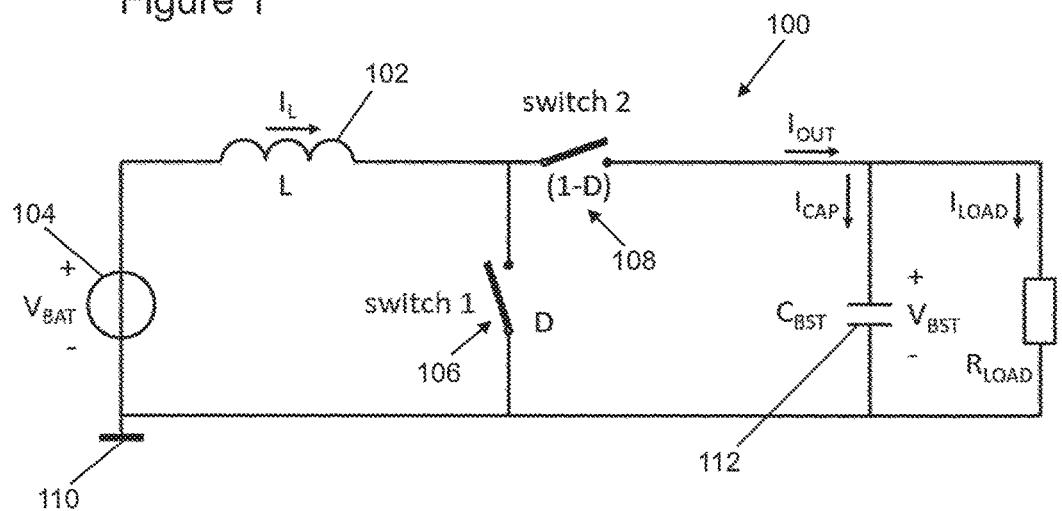
FIG. 1 snows an example circuit diagram of a boost converter.

FIG. 1 shows an example circuit diagram of a boost converter 100, which provides an output-voltage $V_{BST}$. The boost converter includes an inductor 102 that is connected between a battery 104 and two switches: Switch 1 106 and Switch 2 108. The two switches 106, 108 connect the inductor 102 either to ground 110 or to an output capacitor $C_{BST}$ 112. Switch 1 106 is closed with switching frequency $f_{BST}$ (or period T) and duty cycle D. Switch 2 108 is closed when Switch 1 106 is open. The resulting current $I_L$ in the inductor 102 is a triangular shaped current with slopes determined by the battery voltage $V_{BAT}$ and the difference between battery and output-voltage $V_{BAT}$-$V_{BST}$. In the configuration of FIG. 1, the ratio between output-voltage and battery voltage is determined by the duty cycle D used to operate the switches (D'=1−D):

$$V_{BST} = \frac{V_{BAT}}{1-D} = \frac{V_{BAT}}{D'} \quad (1)$$

Figure 2:
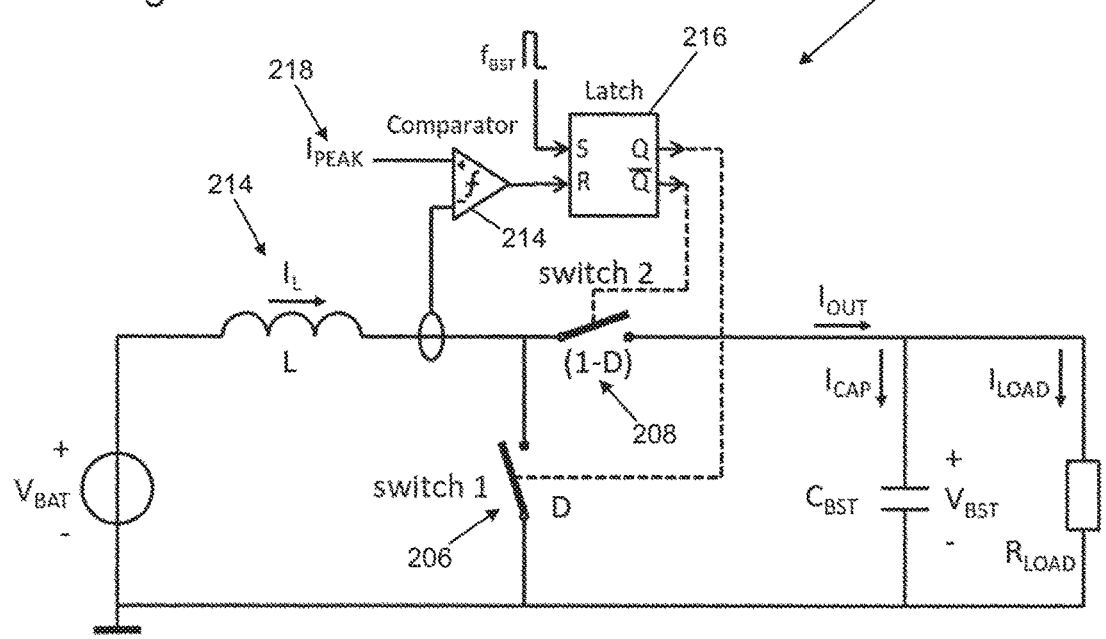
FIG. 2 shows a boost converter with peak current mode control.

FIG. 2 shows a boost converter 200 with peak current mode control. In the current mode controlled boost converter 200 of FIG. 2, the duty cycle control of the switches 206, 208 is performed with peak current mode control. In peak current mode control, the inductor current $I_L$ 214 is compared to a peak-current-control-signal $I_{PEAK}$ 218 by a comparator 214. At the beginning of each cycle, at the rising edge of $f_{BST}$, switch 1 206 is closed and $I_L$ 214 increases with slope $S_1$(>0). As soon as $I_L$ 214 is equal to the peak-current-control-signal $I_{PEAK}$ 218, the comparator 214 resets a latch 216, and switch 2 208 is closed (and switch 1 206 is opened). In response, the inductor current $I_L$ 214 decreases with slope $S_2$ (<0).

Figure 3:
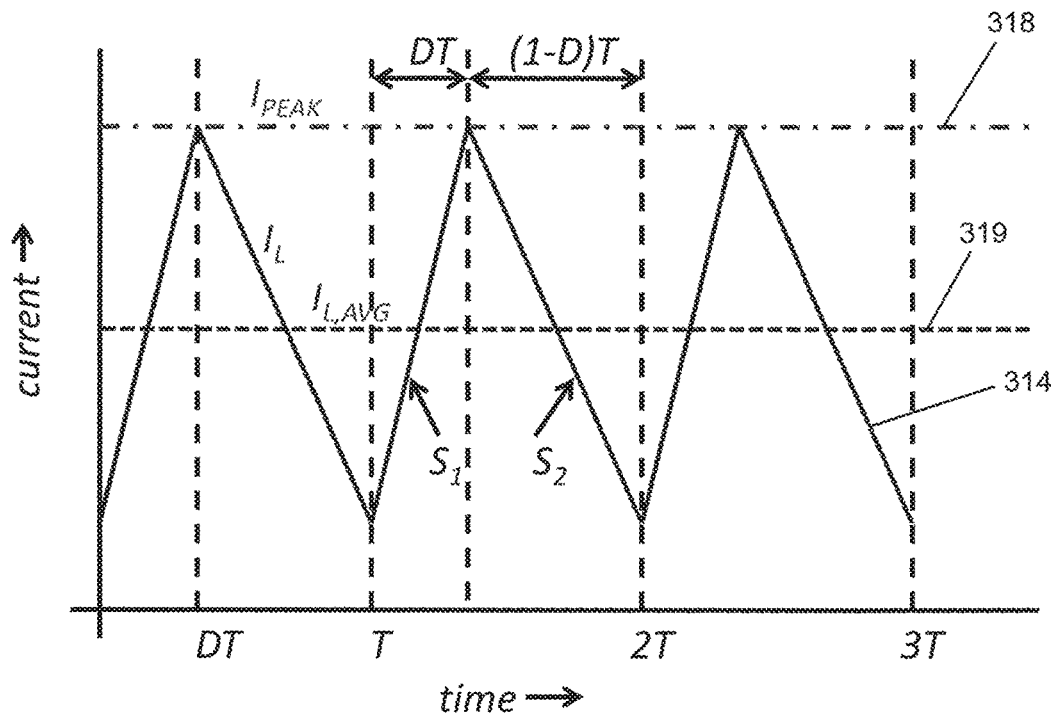
FIG. 3 shows a plot of current versus time for the inductor current $I_L$ of the circuit shown in FIG. 2.

FIG. 3 shows a plot of current (on the vertical axis) versus time (on the horizontal axis) for the inductor current $I_L$ 314 of the circuit shown in FIG. 2. As discussed above, FIG. 2 shows a boost converter operating in peak current control. Also shown in FIG. 3 is the peak-current-control-signal $I_{PEAK}$ 318. Furthermore, the switching periods (T) are marked on the horizontal axis, and a single period is marked up with reference to the duty cycle D that is being used.

In steady state, the operation shown in FIG. 3 defines the relation:

$$S_1 DT + S_2(1-D)T = 0 \quad (2)$$

With this method, the peak value of the triangular inductor current $I_L$ 314 is regulated to the peak-current-control-signal 318. Switch 1 is closed at the rising edge of a clock signal $f_{BST}$ and opened as soon as the measured current through the coil $I_L$ 314 is equal to the peak-current-control-signal $I_{PEAK}$ 318. In FIG. 3, the average inductor current $I_{L,AVG}$ 319 is also shown.

Figure 4:
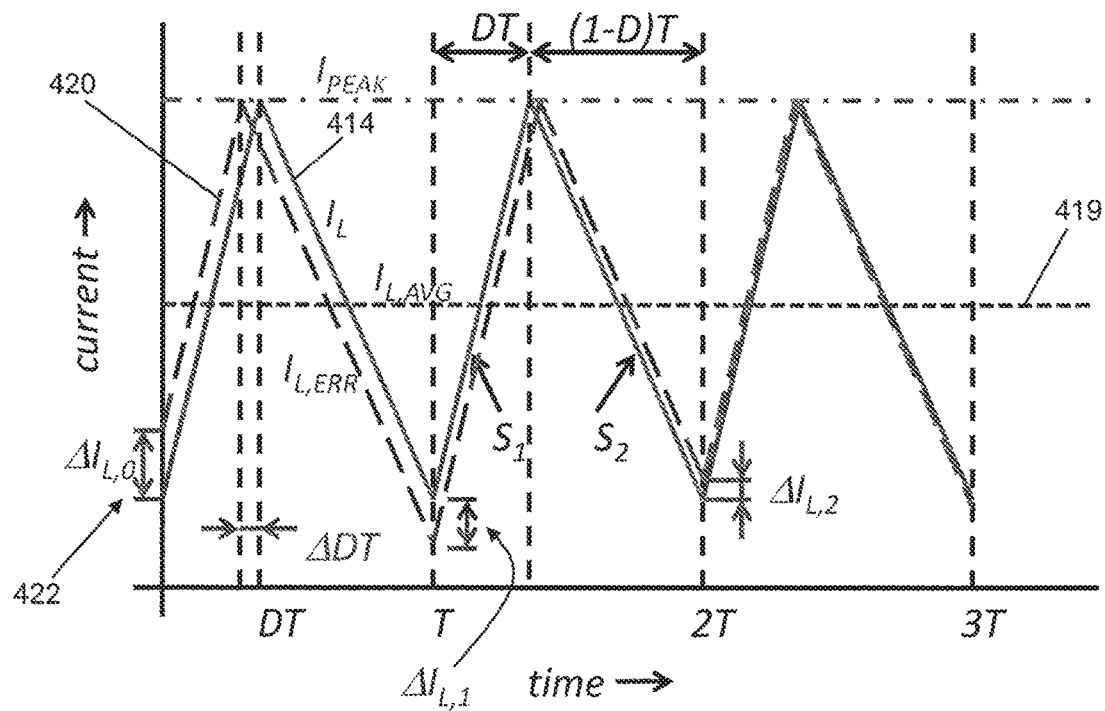
FIG. 4 shows the same waveforms as FIG. 3, and also an inductor-current-with-error $I_{L,ERR}$ signal.

FIG. 4 shows the same waveforms as FIG. 3, and also an inductor-current-with-error $I_{L,ERR}$ 420 signal. FIG. 4 shows the current waveforms in peak current mode control, including error propagation but without slope compensation (which will be described below with reference to FIGS. 6 to 9).

$I_{L,ERR}$ 420 is the actual current in the inductor following a change in the load current (for example at time=0). $I_L$ 414 is the appropriate steady state inductor current for the new load current. As shown in FIG. 4, the system takes a few cycles to adjust to the new load, following which $I_{L,ERR}$ 420 is a good match for $I_L$ 414. $I_{L,AVG}$ 419 represents the average current through the inductor.

In FIG. 4 the propagation of an error $\Delta I_{L,0}$ 422 in the current through the inductor at t=0 can be seen. The duty cycle D of the period with 0<t<T is altered due to the error in the current $\Delta I_{L,0}$ 422 with:

$$\Delta D = -\frac{\Delta I_{L,0}}{S_1} \quad (3)$$

The current error $\Delta I_{L,1}$ at t=T will then be equal to:

$$\Delta I_{L,1} = -\Delta D \; S_2 = \frac{\Delta I_{L,0} S_2}{S_1} \quad (4)$$

The amplification of the current error after one cycle is therefore equal to $$\frac{\Delta I_{L,1}}{\Delta I_{L,0}} = \frac{S_2}{S_1} = \frac{-D}{1-D} \quad (5)$$

After n cycles, the original error has amplified with a factor A(n):

$$\Delta I_{L,n} = \Delta I_{L,0} \; A(n) = \Delta I_{L,0} \left(\frac{S_2}{S_1}\right)^n \quad (6)$$

Since $S_2$>0 and $S_1$>0, the error has en alternating sign. Note that this system is not stable when $|S_2|$>$|S_1|$, so for D>50%. However, in FIG. 4, $|S_2|$<$|S_1|$, and therefore the magnitude of the error $\Delta I_L$ reduces over time.

Figure 5:
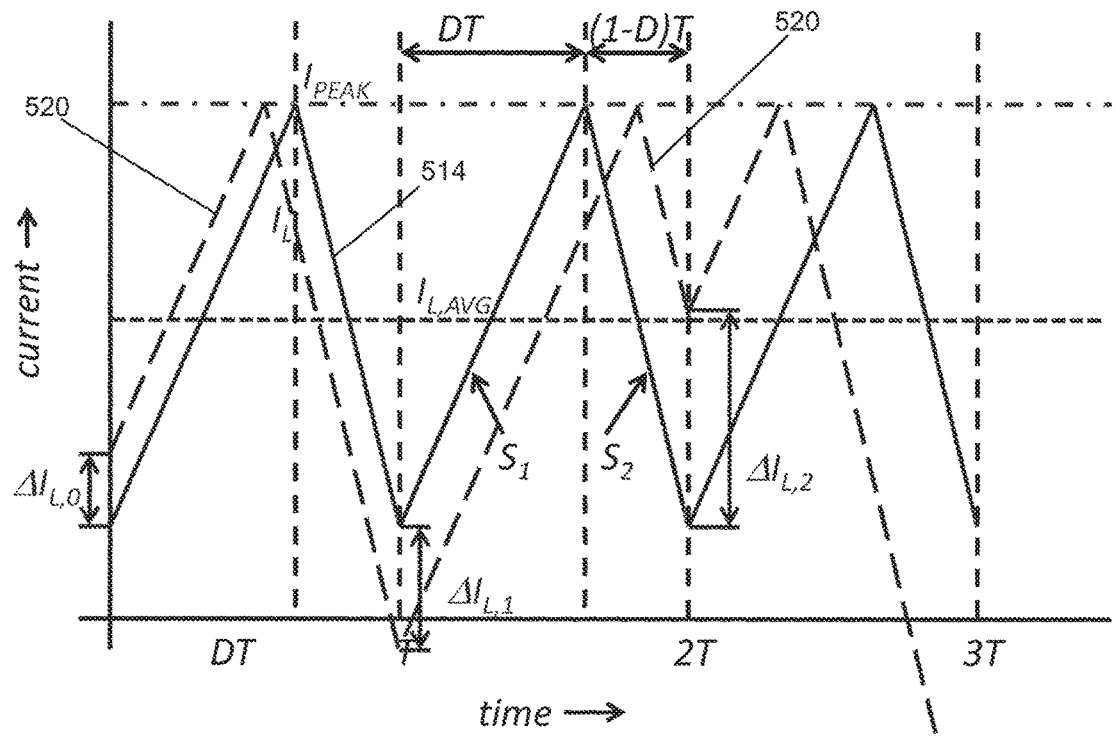
FIG. 5 shows the same current waveforms in peak current mode control as those of FIG. 4, but this time for error propagation with $|S_2|>|S_1|$.

FIG. 5 shows the same current waveforms in peak current mode control as those of FIG. 4, with corresponding reference numbers in the 500 series, but this time for error propagation with $|S_2|$>$|S_1|$. FIG. 5 shows instable behaviour, where the error increases (is amplified) over time, which leads to undesired sub-harmonic oscillations.

Figure 6:
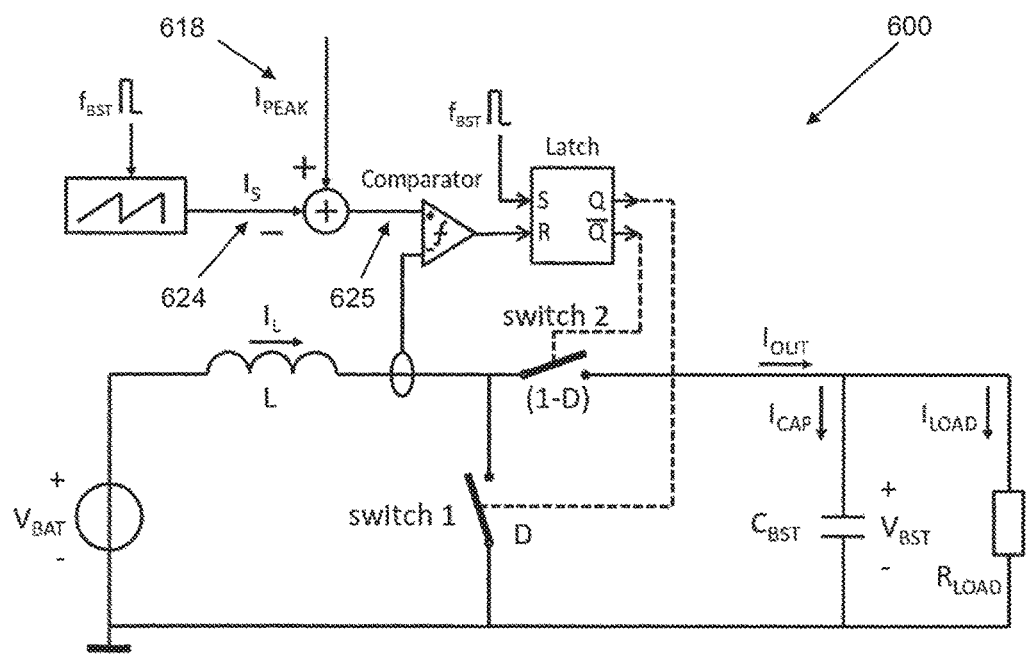
FIG. 6 shows a boost converter with peak current mode control and slope compensation.

FIG. 6 shows a boost converter 600 with peak current mode control and slope compensation.

Stops compensation can be used to control the damping and ensure stable behavior for duty cycles above 50%. With slope compensation, a periodic current $I_S$ 624 with slope $S_3$ is subtracted from the peak-current-control-signal $I_{PEAK}$ 618 as shown in FIG. 6. The result of the subtraction is ($I_{PEAK}$−$I_S$) 625. In this example, linear slope compensation is used; that is, $S_3$ has a constant value.

Figure 7:
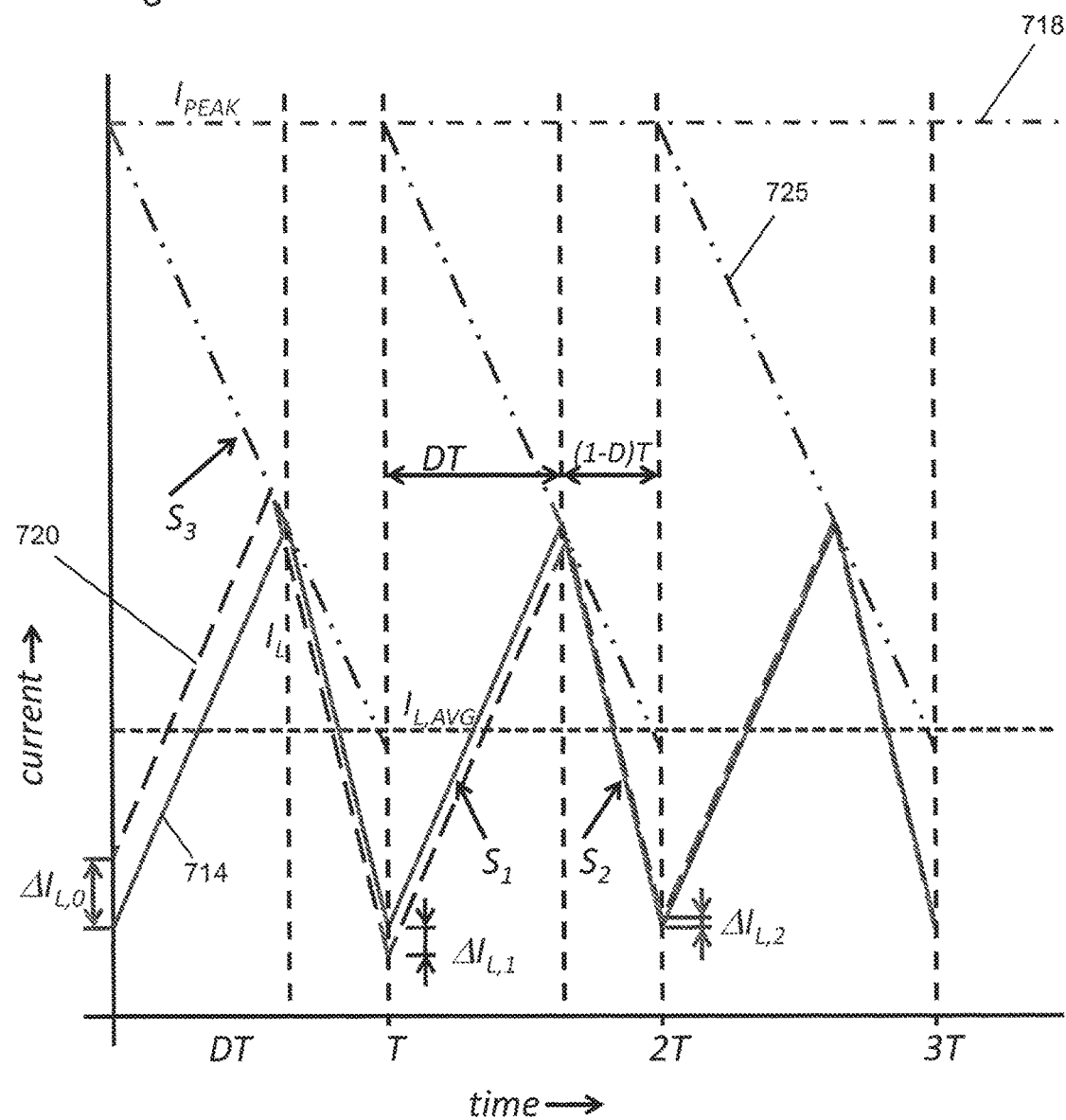
FIG. 7 shows the same current waveforms in peak current mode control as those of FIGS. 4 and 5, and also $(I_{PEAK}-I_S)$.

FIG. 7 shows the same current waveforms in peak current mode control as those of FIGS. 4 and 5, with corresponding reference numbers in the 700 series. FIG. 7 also shows ($I_{PEAK}$−$I_S$) 725, which is identified in FIG. 6. FIG. 7 shows current mode control with slope compensation and $|S_2|$>$|S_1|$, having stable behavior.

For the circuit of FIG. 6 and waveforms of FIG. 7, the duty cycle D of the first period 0<t<T will then be altered with $$\Delta D = \frac{\Delta I_{L,0}}{S_1 - S_3} \quad (7)$$

The current error at t=T will now be equal to:

$$\Delta I_{L,1} = -\Delta D \; (S_2 - S_3) = \frac{\Delta I_{L,0}(S_2 - S_3)}{S_1 - S_3} \quad (8)$$

The amplification of the error is therefore equal to $$\frac{\Delta I_{L,1}}{\Delta I_{L,0}} = \frac{S_2 - S_3}{S_1 - S_3} \quad (9)$$

After n cycles, the original error $I_{L,0}$ has amplified with a factor A(n):

$$\Delta I_{L,n} = \Delta I_{L,0} A(n) = \Delta I_{L,0} \left(\frac{S_2 - S_3}{S_1 - S_3}\right)^n \quad (10)$$

To guarantee stability, $S_3$ should be chosen in such a way that the magnitude of the term between the brackets is below 1. Otherwise, the error explodes and sub harmonic oscillations can occur.

$$|A| < 1 \text{ or } \left|\frac{S_2 - S_3}{S_1 - S_3}\right| < 1 \quad (11)$$

Consider that only $S_1$ is positive, and $S_2$ and $S_3$ are negative. The term between the brackets can be both negative and positive, dependent on $S_3$.

$S_2 < S_3 < 0$  $-1 < A < 0$ the under damped case, the error is alternating in sign.

$S_3 < S_2 < 0$  $0 < A < 1$ the over damped case, the error keeps the same sign.

$S_3 < S_2 < 0$  $A = 0$ the critically damped case, the error is corrected in a single period.

The situation with $S_3 = S_2$, or $A = 0$, gives the fastest possible transient response. This can be the optimum slope control.

Figure 8:
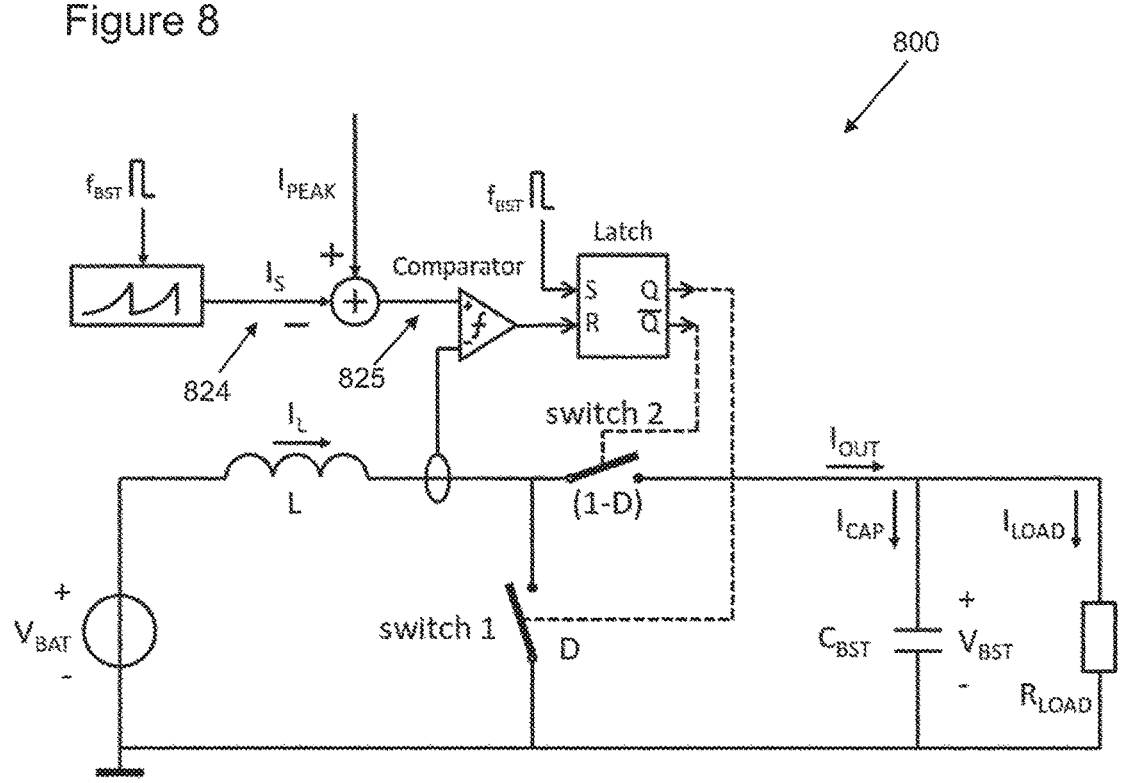
FIG. 8 shows a boost converter with peak current mode control and parabolic slope compensation.

FIG. 8 shows a boost converter 800 with peak current mode control and parabolic slope compensation. In this example, a periodic current $I_S$ 824 with a parabolic slope is used.

Figure 9:
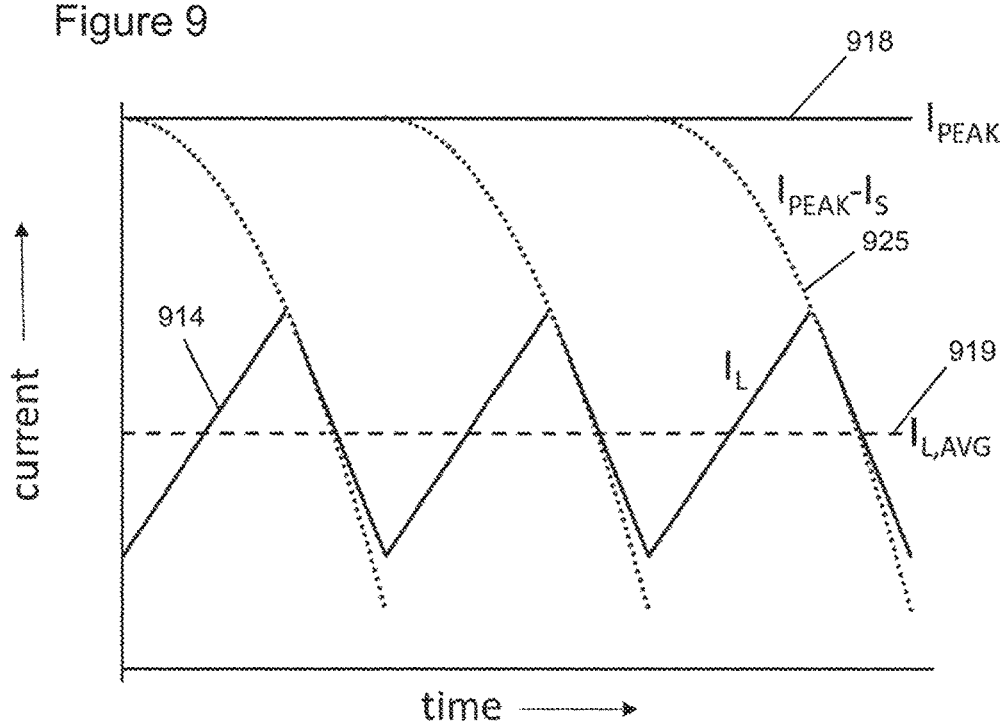
FIG. 9 shows various current waveforms for the circuit of FIG. 8.

FIG. 9 shows the following current waveforms for the circuit of FIG. 8:

inductor-current $I_L$ 914;
peak-current-control-signal $I_{PEAK}$ 918;
($I_{PEAK} - I_S$); and
average inductor currant $I_{L,AVG}$ 919.

In the boost converter, the current slopes $S_1$ and $S_2$ depend on the duty cycle D.

$$S_1(D) = \frac{V_{BAT}}{L} = (1-D)\frac{V_{BST}}{L} = D'\frac{V_{BST}}{L} \quad (12)$$

$$S_2(D) = \frac{V_{BAT} - V_{BST}}{L} = \frac{(1-D)V_{BST} - V_{BST}}{L} = -D\frac{V_{BST}}{L} \quad (13)$$

When a constant value is chosen for $S_3$ (as in FIGS. 6 and 7), there is only one operating condition where the damping is critical (A=0). Even when |A|<1 for all operating conditions and stability is guaranteed, this means that the error correction can take many periods thereby resulting in a slow response. When optimal slope control with critical damping is required (with $S_3 = S_2$) for all values of D, then the value of $S_3$ should also depend on the duty cycle D:

$$S_3(D) = -D\frac{V_{BST}}{L} \quad (14)$$

So, at t=DT, the slope current derivative should be equal to $S_3$. Or, in the time domain:

$$S_3(t) = -\frac{\varepsilon V_{BST}}{TL} \quad (15)$$

If the derivative of the slope current $S_3$ depends linearly on the relative time in the period, the current itself depends on the square of the relative time, starting at 0 for t/T=0:

$$I_S(t) = \int_{x=0}^{x=t} -S_3(x)dx = \frac{V_{BST}}{TL}\int_{x=0}^{x=t} x\,dx = \frac{V_{BST}t^2}{2TL} = \frac{V_{BST}T}{2L}\left(\frac{t}{T}\right)^2 = \frac{V_{BST}}{2fL}\left(\frac{t}{T}\right)^2 \quad (16)$$

Figure 10:
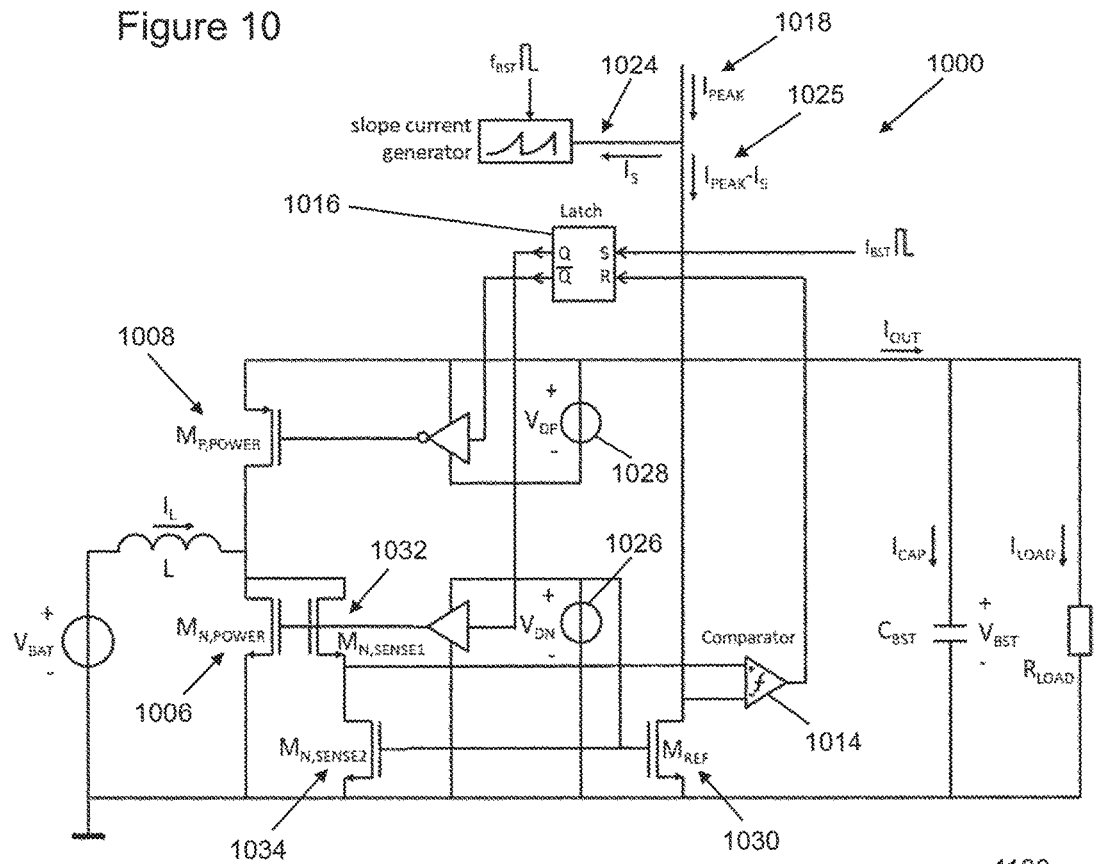
FIG. 10 shows a boost converter with peak current mode control and parabolic slope compensation, with a more detailed view of the switches and the current measurement.

FIG. 10 shows a boost converter 1000 with peak current mode control and parabolic slope compensation, which is similar to the circuit of FIG. 8 but with a more detailed view of the switches and the current measurement. Components that are shown in earlier figures have been given corresponding reference numbers in the 1000 series, and will not necessarily be described again here.

The power switches 1006, 1008 of the boost converter are implemented with power transistors: $M_{N,POWER}$ 1006, which corresponds to switch 1 in earlier figures; and $M_{P,POWER}$ 1008, which corresponds to switch 2 in earlier figures. These two power switches 1006, 1008 are driven by drivers that supplied by voltage sources $V_{DN}$ 1026 and $V_{DP}$ 1030 respectively.

The parabolic slope current $I_S$ 1024 is extracted from the peak-current-control-signal $I_{PEAK}$ 1018. The resulting current ($I_{PEAK} - I_S$) 1025 is forced into a reference transistor $M_{REF}$ 1030, which is a scaled replica of the power transistor $M_{N,POWER}$ 1006 with scaling factor K. At the positive edge of $f_{BST}$, $M_{N,POWER}$ 1006 is switched on by pulling its gate voltage towards $V_{DN}$ 1026 which is the supply voltage for the driver stage. The gate of the reference transistor $M_{REF}$ 1032 is also at $V_{DN}$. Sense transistors $M_{N,SENSE1}$ 1032 and $M_{N,SENSE2}$ 1034 divide the voltage across the power transistor $M_{N,POWER}$ 1006 by a factor two when $M_{N,POWER}$ 1006 is on, and pull the positive input of the comparator 1014 to ground when $M_{N,POWER}$ 1006 is off.

The output of the comparator 1014 will now change when:

$$I_L = 2K(I_{PEAK} - I_S) \quad (17)$$

When the output of the comparator 1014 changes: the latch 1016 is reset: $M_{N,POWER}$ 1006 is switched off; and $M_{P,POWER}$ 1008 is switched on until the next positive edge of $f_{BST}$.

Figure 11:
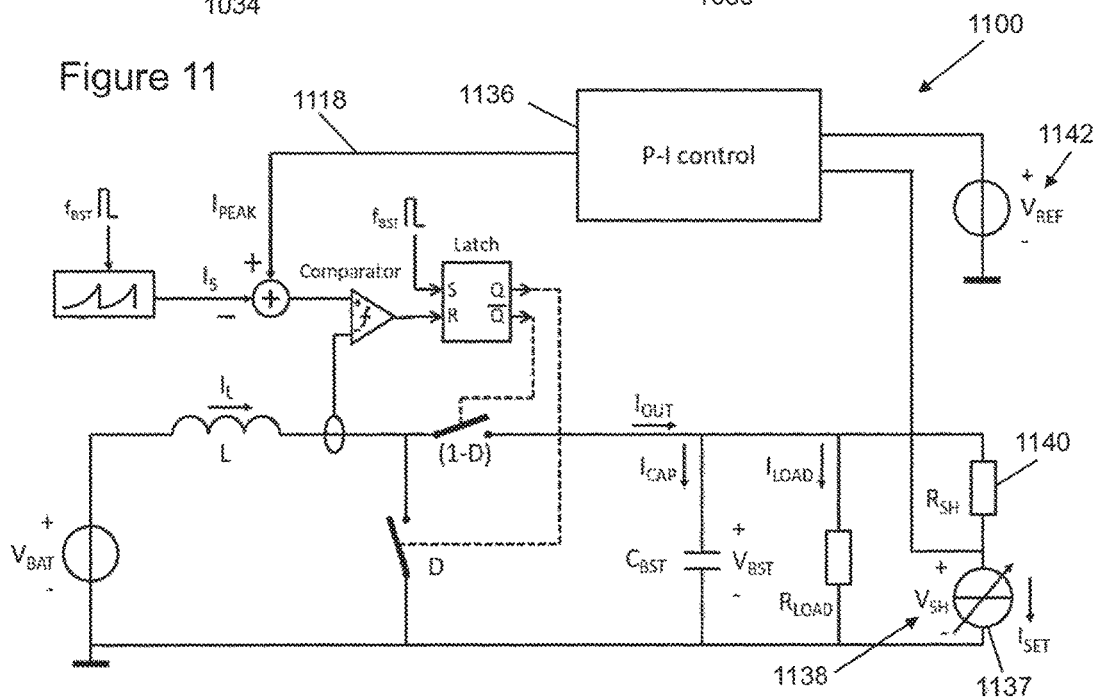
FIG. 11 shows a boost converter with peak current mode control, parabolic slope compensation and a P-I controller for providing an output-voltage control loop.

FIG. 11 shows a boost converter 1100 with peak current mode control, parabolic slope compensation, and a P-I controller 1136 for providing an output-voltage control loop.

The set point for the output-voltage $V_{BST}$ in FIG. 11 is created by a programmable current source 1137, which provides a current $I_{SET}$. The programmable current source 1137 can use $I_{SET}$ to set the voltage across a sense resistor $R_{SH}$ 1140. This voltage across $R_{SH}$ 1140, can be referred to as a sense-voltage $V_{SH}$ 1138, and is equal to:

$$V_{SH} = V_{BST} - R_{SH}I_{SET} \quad (18)$$

The P-I controller 1136 compares this sense-voltage $V_{SH}$ 1138 to a reference voltage $V_{REF}$ 1142, which is provided by a reference-voltage-source in FIG. 11. The difference between $V_{REF}$ 1142 and $V_{SH}$ 1138 can be referred to as the error voltage. The P-I controller 1136 then translates the error voltage to the peak-current-control-signal $I_{PEAK}$ 1118.

The P-I controller 1138 adjusts the peak-current-control-signal $I_{PEAK}$ 1118 (based on the error voltage) to set the output-voltage $V_{BST}$ of the boost converter. More particularly, the P-I controller 1136 can adjust the current through the boost converter and bring the sense-voltage $V_{SH}$ closer to the reference-voltage $V_{REF}$. In this example, the peak-current-control-signal $I_{PEAK}$ 1118 is used to control the duty cycle for the switching cycle of the boost converter, thereby controlling the output-voltage $V_{BST}$.

Figure 12:
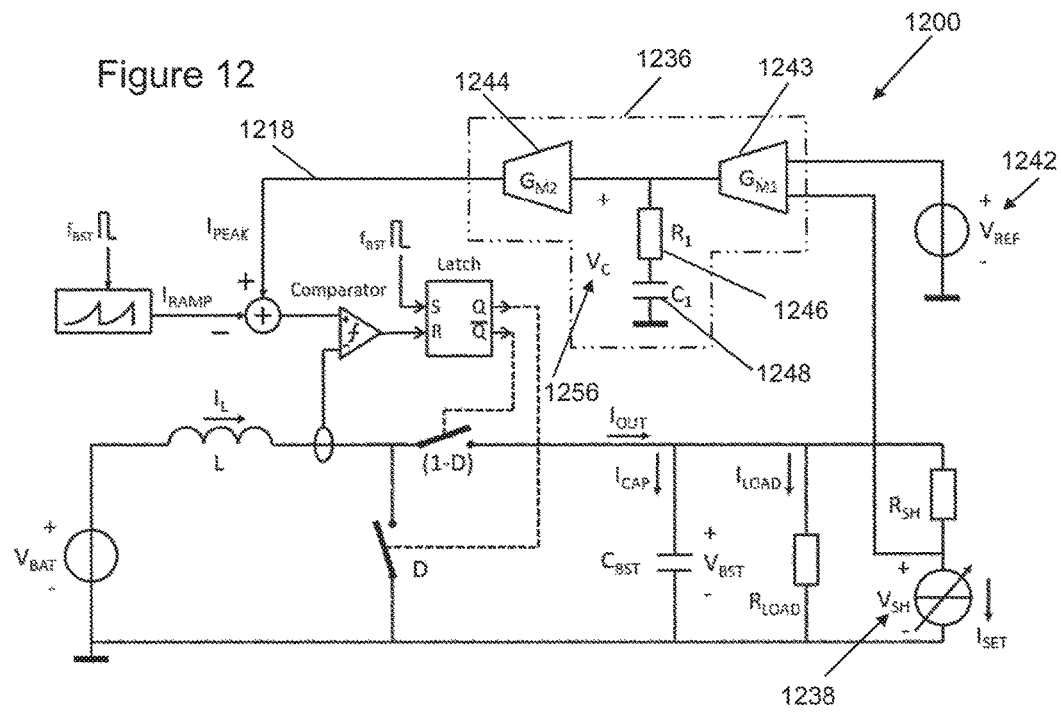
FIG. 12 shows a boost converter, which is similar to the boost converter of FIG. 11, with peak current mode control and parabolic slope compensation, with further details of an implementation of the P-I controller.

FIG. 12 shows a boost converter 1200, which is similar to the boost converter of FIG. 11, with peak current mode control and parabolic slope compensation. FIG. 12 shows further details of an implementation of the P-I controller 1236, which provides the output voltage control loop.

If the boost voltage is an target, then $V_{REF}=V_{SH}$ and $$V_{BST}=V_{REF}+R_{SH}I_{SET} \quad (19)$$

The P-I controller 1236 includes a first transconductance-amplifier-control-block $G_{M1}$ 1243 and a second transconductance-amplifier-control-block $G_{M2}$ 1244. The first transconductance-amplifier-control-block $G_{M1}$ 1243 receives the sense-voltage $V_{SH}$ 1238 and the reference voltage $V_{REF}$ 1242, and provides an output signal that has a current that is based on the difference between $V_{SH}$ 1238 and $V_{REF}$ 1242. A control-resistor $R_1$ 1246 and a control-capacitor $C_1$ are connected in series between the output terminal of the first transconductance-amplifier-control-block $G_{M1}$ 1243 and ground. In this way, the current that is provided as the output signal of the first transconductance-amplifier-control-block $G_{M1}$ 1243 causes a control-voltage $V_C$ 1256 to be dropped across the control-resistor $R_1$ 1246 and the control-capacitor $C_1$.

The P-I controller 1236 can generate the control-voltage $V_C$ 1256 by integrating the difference between: (i) the sense-voltage $V_{SH}$ 1238; and (ii) the reference-voltage $V_{REF}$ 1242. In this way, the control-voltage $V_C$ 1256 can be considered as the integrated error voltage in some examples.

The second transconductance-amplifier-control-block $G_{M2}$ 1244 converts the control-voltage $V_C$ 1256 to the peak-current-control-signal $I_{PEAK}$ 1218. An input terminal of the second transconductance-amplifier-control-block $G_{M2}$ 1244, which receives the control-voltage $V_C$ 1256, can be referred to as a control-voltage-input-terminal.

Figure 13:
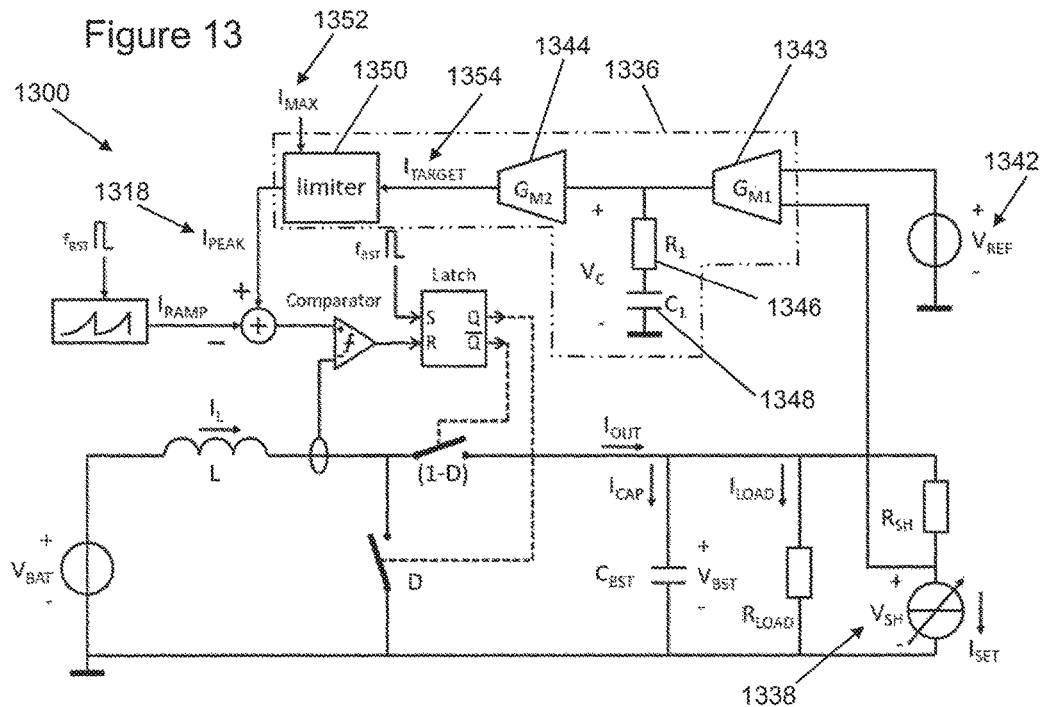
FIG. 13 shows a boost converter, which is similar to the boost converter of FIG. 12, with peak current mode control, parabolic slope compensation, an output voltage control loop and also a current-limiter.

FIG. 13 shows a boost converter 1300, which is similar to the boost converter of FIG. 12, with peak current mode control, parabolic slope compensation, and an output voltage control loop. FIG. 13 also includes a current-limiter 1350.

In this example, the output signal from the second transconductance-amplifier-control-block $G_{M2}$ 1344 is labelled as $I_{TARGET}$ 1354 and may be referred to as a target-current-control-signal. In the same way as discussed above, the target-current-control-signal $I_{TARGET}$ 1354 is configured to adjust the current through the boost converter in order to bring the sense-voltage $V_{SH}$ closer to the reference-voltage $V_{REF}$; optionally by setting the peak current through the inductor in the boost converter 1300.

The current-limiter 1350 can limit the peak-current-control-signal $I_{PEAK}$ 1318. The current-limiter is connected to the output terminal of the second transconductance-amplifier-control-block $G_{M2}$ 1344, such that it receives the target-current-control-signal $I_{TARGET}$ 1354. The current-limiter 1350 provides the peak-current-control-signal $I_{PEAK}$ as the target-current-control-signal $I_{TARGET}$ 1354 limited to a max-current-control-value $I_{MAX}$ 1352. That is:

(i) the peak-current-control-signal $I_{PEAK}$ 1318 equals the target-current-control-signal $I_{TARGET}$ 1354, when the target-current-control-signal $I_{TARGET}$ 1354 is less than or equal to the max-current-control-value $I_{MAX}$ 1352; and (ii) the peak-current-control-signal $I_{PEAK}$ 1318 equals the max-current-control-value $I_{MAX}$ 1352, when the target-current-control-signal $I_{TARGET}$ 1354 is greater than the max-current-control-value $I_{MAX}$ 1352.

The max-current-control-value $I_{MAX}$ 1352 can be considered as defining a programmable maximum average current level. The maximum peak current level can depend on the maximum average current $I_{L,AVG,MAX}$, battery voltage $V_{BAT}$, boost voltage $V_{BST}$, inductor value L and switching frequency f:

$$I_{PEAK,MAX} = I_{L,AVG,MAX} + \frac{V_{BST} - V_{BAT}}{2fL} \quad (20)$$

Figure 14:
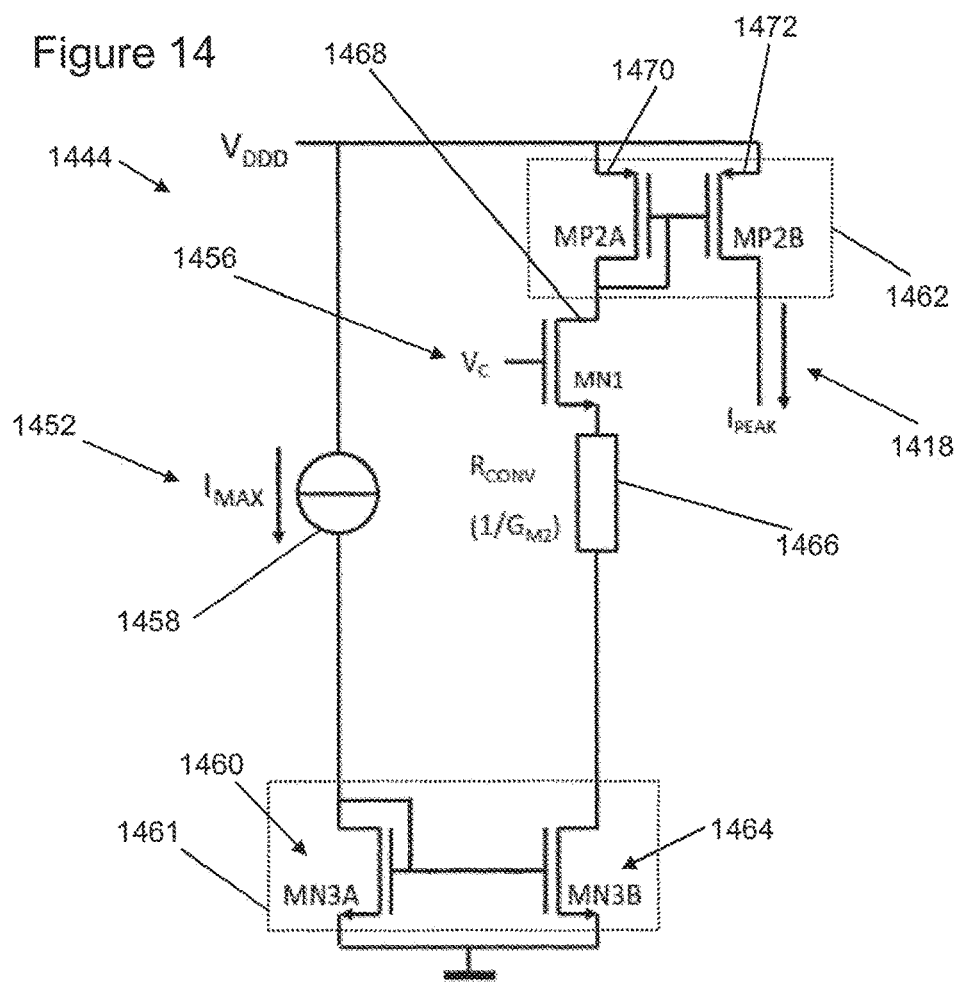
FIG. 14 shows an example implementation of a second transconductance amplifier-control-block, which provides the functionality of both the second transconductance-amplifier-control-block and the current-limiter of FIG. 13.

FIG. 14 shows an example implementation of a second transconductance-amplifier-control-block 1444, which provides the functionality of both the second transconductance-amplifier-control-block $G_{M2}$ and the current-limiter of FIG. 13.

The second transconductance-amplifier-control-block 1444 receives the control-voltage $V_C$ 1456 as an input signal, and provides the peak-current-control-signal $I_{PEAK}$ 1418 as an output signal. In line with the above discussion, the second transconductance-amplifier-control-block 1444 converts the control-voltage $V_C$ 1456 into a current signal, and then limits/caps that current signal at a maximum value in order to provide the peak-current-control-signal $I_{PEAK}$ 1418.

The second transconductance-amplifier-control-block 1444 includes a max-current-source 1458, which provides a current signal at the max-current-control-value $I_{MAX}$ 1452. The second transconductance-amplifier-control-block 1444 also includes a first current mirror 1461, which includes a first-mirror-first-transistor MN3A 1460 and a first-mirror-second-transistor MN3B 1464. The conduction channel of the first-mirror-first-transistor MN3A 1460 is connected in series with the max-current-source 1458.

The second transconductance-amplifier-control-block 1444 also includes an input-transistor MN1A 1468, which receives the control-voltage $V_C$ 1456 at its control terminal. The conduction channel of the input-transistor MN1A 1468 is connected in series with: (i) a conversion-resistor $R_{CONV}$ 1466; and (ii) the conduction channel of the first-mirror-second-transistor MN3B 1464. The value of the conversion-resistor $R_{CONV}$ 1466 defines the value of transconductance of the second transconductance-amplifier-control-block 1444: $G_{M2}=1/R_{CONV}$.

FIG. 14 also shows a second current mirror 1482, which includes a second-mirror-first-transistor MN2A 1470 and a second-mirror-second-transistor MN2B 1472. The conduction channel of the second-mirror-first-transistor MN2A 1470 is also connected in series with the conduction channel of the input-transistor MN1A 1468. The conduction channel of the second-mirror-second-transistor MN2B 1472 provides the peak-current-control-signal $I_{PEAK}$ 1418.

(In this example the transistors are FETs, and therefore their control terminals are gate terminals, and their conduction channels extend between a drain terminal and a source terminal. In other examples, BJTs can be used instead of FETS.)

For low levels of the control-voltage $V_C$ 1456, the first-mirror-second-transistor MN3B 1464 is in its linear region, and therefore the peak-current-control-signal $I_{PEAK}$ 1418 will be equal to $$I_{PEAK} = \frac{v_C - v_{T,MN_1}}{R_{CONV} + R_{MN_sB}} \quad (21)$$

That is, changes to the control-voltage $V_C$ 1456 when it has a "low value" (that is, one that does not saturate the first-mirror-second-transistor MN3B 1464), cause a change in the current flowing through the second-mirror-first-transistor MN2A 1470, which in turn causes a change in the $I_{PEAK}$ current 1418 flowing through the second-mirror-second-transistor MN2B 1472.

When the control-voltage $V_C$ 1456 is sufficiently increased, the peak-current-control-signal $I_{PEAK}$ 1418 will saturate to $I_{MAX}$ 1452 because the first-mirror-second-transistor MN3B 1464 will go into the saturation region, and limit the current through the input-transistor MN1 1468 to $I_{MAX}$ 1452. Any further voltage increase of the control-voltage $V_C$ 1456 will be followed by a voltage increase on the drain of the first-mirror-second-transistor MN3B 1464 without changing the current through the first-mirror-second-transistor MN3B 1464.

Therefore, when the load current is increased, a point will be reached where the current through the coil/inductor of the boost converter will be limited.

Figure 15:
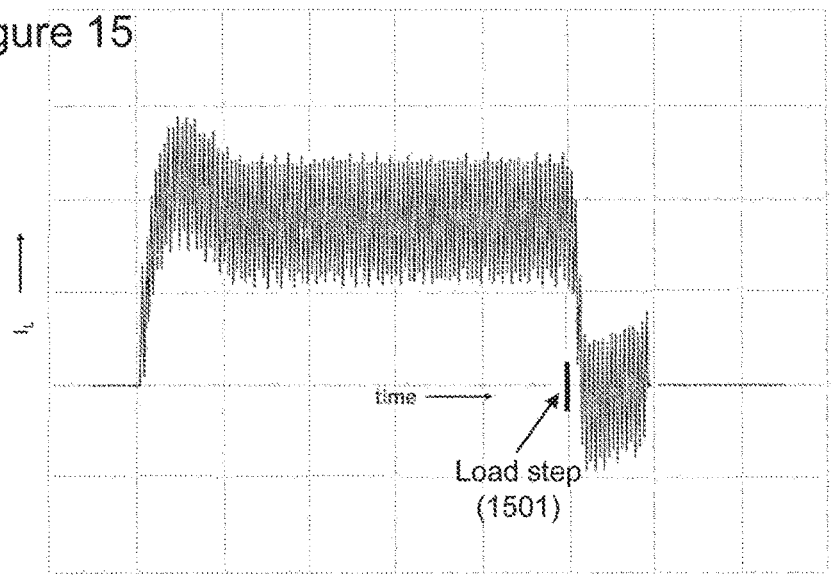
FIG. 15 shows a plot of inductor current $I_L$ versus time for a step-up and step-down in the load current, for the circuit of FIG. 13.

FIG. 15 shows a plot of inductor current $I_L$ versus time for a step-up and step-down in the load current, for the circuit of FIG. 13. The timing of the load step down is labelled in FIG. 15 with reference number 1501. For the plot of FIG. 15, the inductor current $I_L$ does not exceed the max-current-control-value $I_{MAX}$, and therefore no current limiting occurs.

Figure 16:
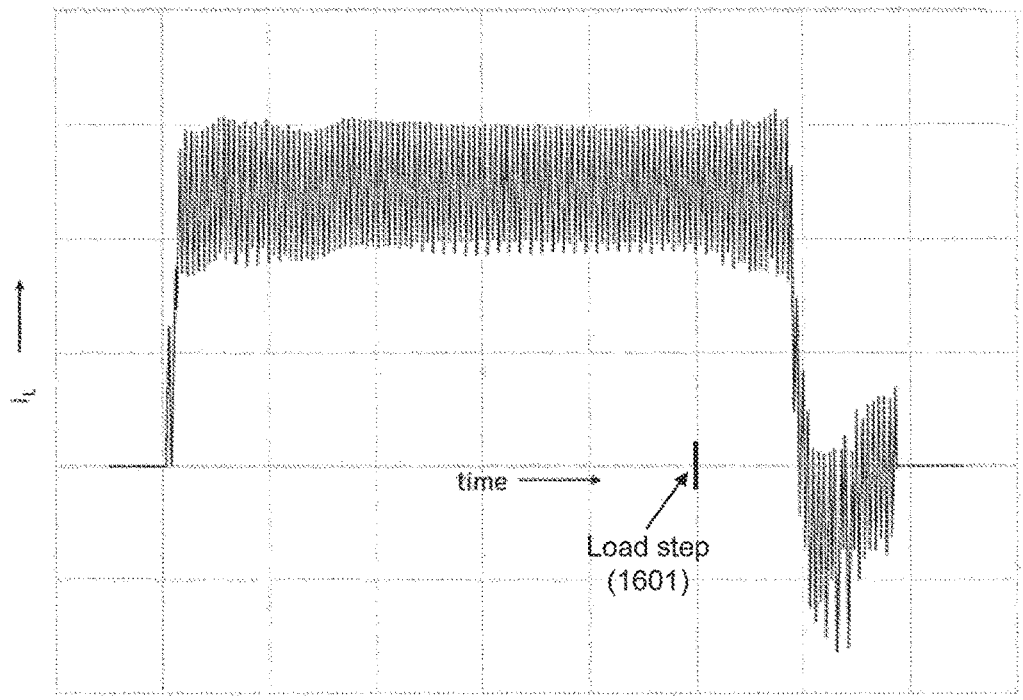
FIG. 16 shows another plot of inductor current $I_L$ versus time for a step-up and step-down in the load current.

FIG. 16 shows another plot of inductor current $I_L$ versus time for a step-up and step-down in the load current. Again, the timing of the load step down is labelled in FIG. 16 with reference number 1601. The size of the load current step for FIG. 16 has double the amplitude of the load current step for FIG. 15. For FIG. 16, the maximum average inductor current is exceeded and therefore the inductor current $I_L$ is limited to the max-current-control-value $I_{MAX}$.

Figure 17:
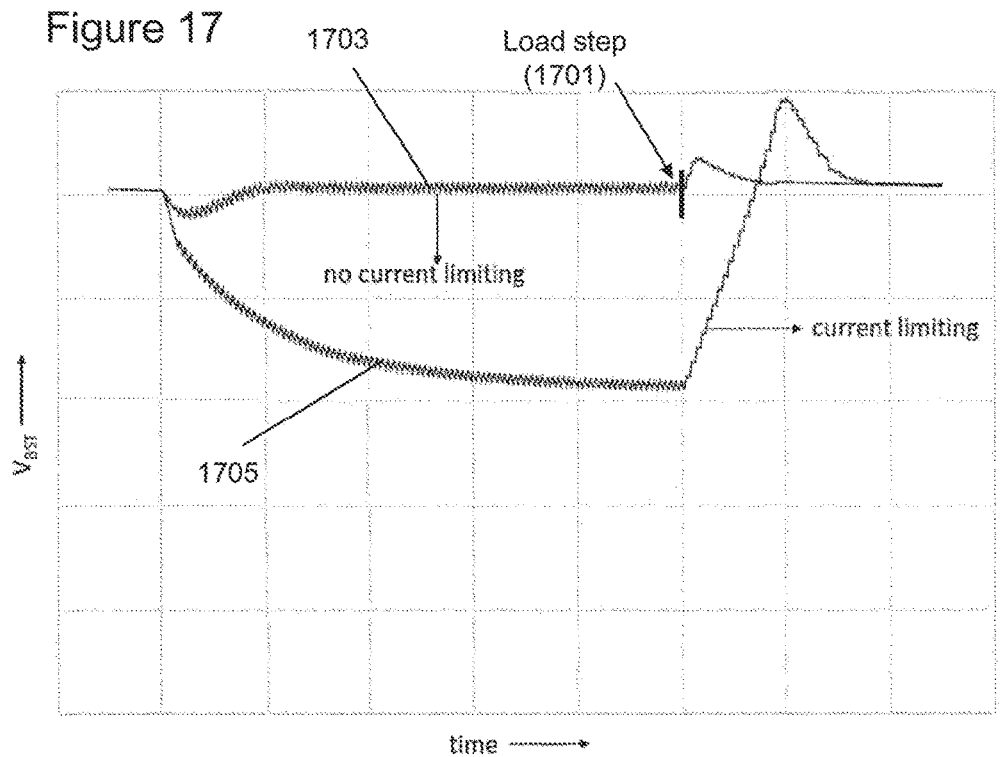
FIG. 17 shows two plots of output-voltage $V_{BST}$ versus time.

FIG. 17 shows two plots of output-voltage $V_{BST}$ versus time:
a first plot 1703 that corresponds to the load step-up and step-down of FIG. 15, that is a load step that does not result in current limiting; and
a second plot 1705 that corresponds to the load step-up and step-down of FIG. 16, that is a load step that does result in current limiting.

The second plot 1705 shows that the output-voltage $V_{BST}$ can collapse when current limiting is used.

With reference to the PI-controller 1336 of FIG. 13, when current limiting is active, the error voltage at the input of $G_{M1}$ 1343 will grow since the control loop is no longer capable of regulating the output-voltage $V_{BST}$. The integrating character of the PI-controller 1336 can causes the control-voltage $V_C$ to drift to the supply voltage of $G_{M1}$ 1343, and away from the normal operating region.

Figure 18:
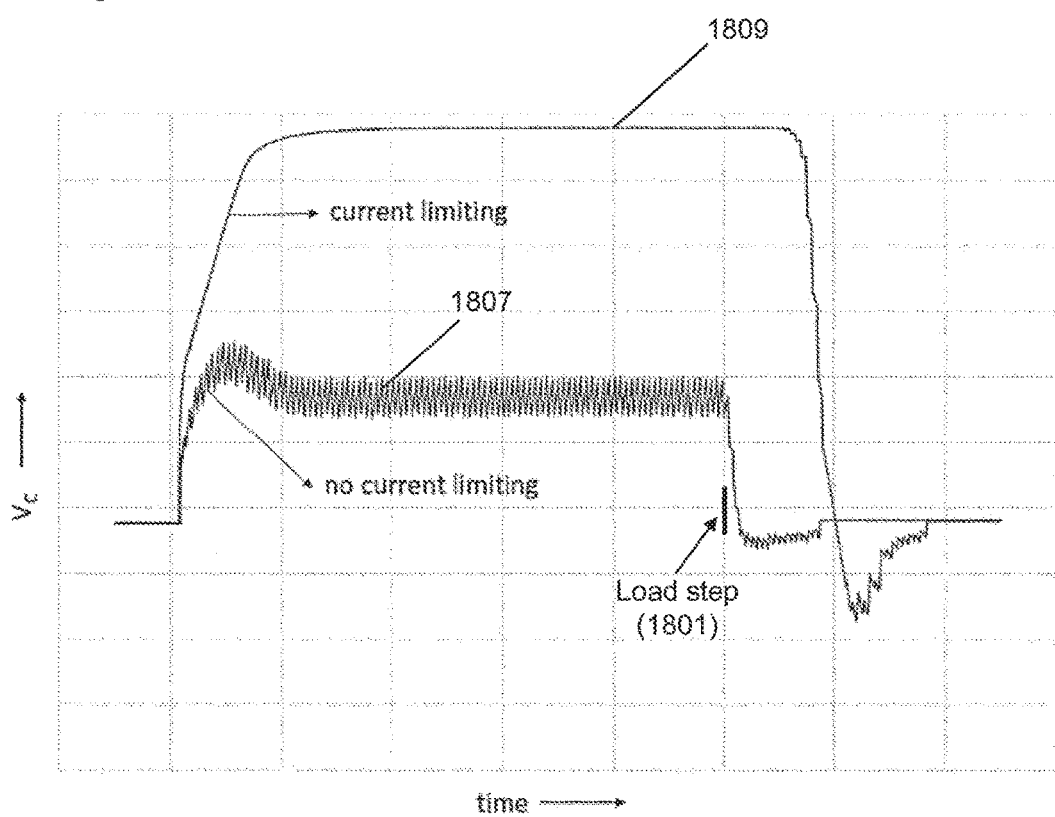
FIG. 18 shows two plots of the control-voltage $V_C$ versus time.

FIG. 18 shows two plots of the control-voltage $V_C$ versus time:
a first plot 1807 that corresponds to the load step-up and step-down of FIG. 15, that is a load step that does not result in current limiting; and
a second plot 1809 that corresponds to the load step-up and step-down of FIG. 16, that is a load step that does result in current limiting.

As can be seen from the second plot 1809 in FIG. 18, due to the integrating character of the PI-controller, the control-voltage $V_C$ drifts away from the normal operating region. When the load current drops to normal levels again at load step 1801, the current through the coil $I_L$ will stay at the maximum level until the output-voltage $V_{BST}$ is regulated back to the target level. Then recovery starts, the error voltage (difference between $V_{SH}$ and $V_{REF}$) changes sign, and the control-voltage $V_C$ will reduce until the normal operating region is reached again. Because of the drift of $V_C$ during current limiting, this recovery can take a significant amount of time, which can be too long for some applications. During this recovery time, the coil current $I_L$ can be too high, thereby causing an overshoot on the output-voltage $V_{BST}$ that is significantly higher than for a load step without current limiting. This undesired overshoot can be seen in the second plot of FIG. 17, after the load step.

One or more of the following circuits can advantageously prevent or reduce drift of the control-voltage $V_C$ when current limiting is used. For example, the control-voltage $V_C$ can be clamped to the voltage level at which current limiting starts. In this way, the control-voltage $V_C$ may not leave the normal operating region. When the load subsequently reduces to a lower level that does not require current limiting, normal operation can be resumed more quickly, and in some examples immediately. This can beneficially reduce the overshoot on the output-voltage to a level that would occur without current limiting.

Figure 19:
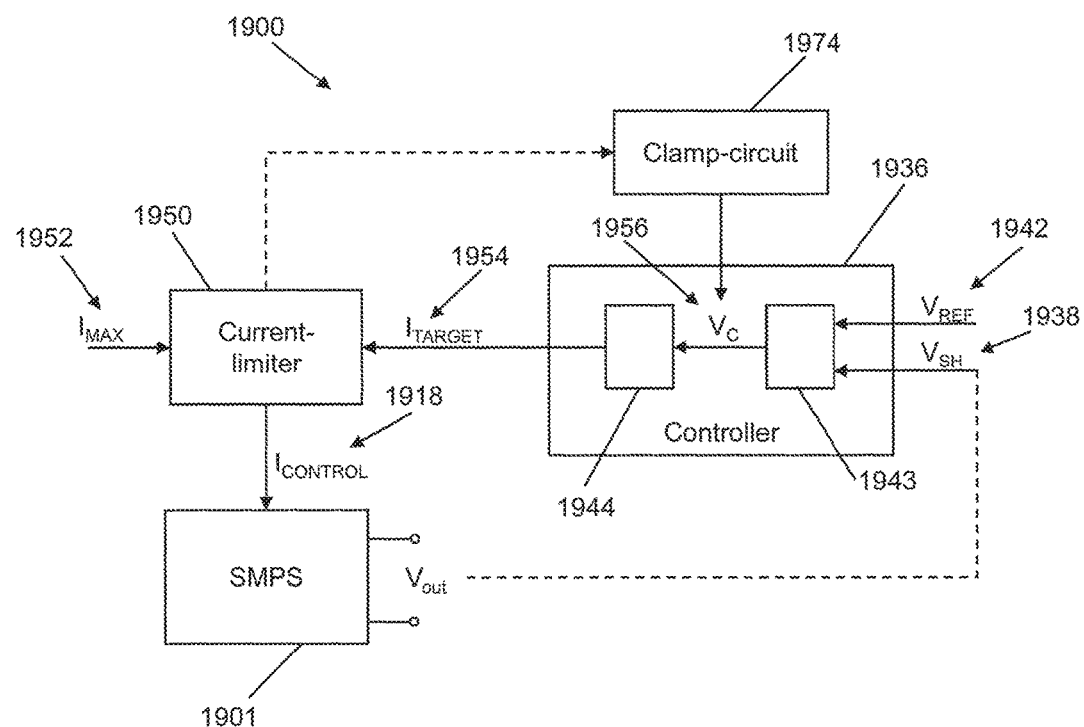
FIG. 19 shows an example embodiment of a circuit that includes a switched-mode-power-supply.

FIG. 19 shows an example embodiment of a circuit 1900 that includes a switched-mode-power-supply (SMPS) 1901. The SMPS 1901 may be a boost converter, as discussed above. In other examples, the SMPS 1901 may be a buck converter, a buck-boost converter or a flyback converter, as non-limiting examples.

The SMPS 1901 receives a current-control-signal $I_{CONTROL}$ 1918, and provides an output-voltage $V_{OUT}$ based an the current-control-signal $I_{CONTROL}$ 1918. In some examples the current-control-signal $I_{CONTROL}$ 1918 can be a peak-current-control-signal as discussed above.

The circuit 1900 includes a controller 1936. In some examples, the controller 1936 can operate the SMPS 1901 in a fixed frequency mode of operation. The controller 1936 can generate a control-voltage $V_C$ 1956 based on the difference between: (i) a sense-voltage $V_{SH}$ 1938; and (ii) a reference-voltage $V_{REF}$ 1942. The sense-voltage $V_{SH}$ 1938 is representative of the output-voltage $V_{OUT}$ of the SMPS 1901, and can be implemented as shown in FIG. 11 for example. In this example, the control-voltage $V_C$ 1956 is a signal that is internal to the controller 1936.

The controller 1936 can also generate a target-current-control-signal $I_{TARGET}$ 1954 based on the control-voltage $V_C$ 1956. The target-current-control-signal $I_{TARGET}$ 1954 is configured to adjust the current through the SMPS 1901 in order to bring the sense-voltage $V_{SH}$ 1938 closer to the reference-voltage $V_{REF}$ 1942. The controller 1936 can perform this functionality in the same way as described above, for example with reference to FIG. 11.

The circuit 1900 also includes a current-limiter 1950. The current-limiter 1950 can be implemented as part of the controller 1936 (as will be discussed below with reference to FIG. 20), or as a separate block as shown in FIG. 19. The current-limiter 1950 provides the current-control-signal $I_{CONTROL}$ 1918 as the target-current-control-signal $I_{TARGET}$ limited to a max-current-control-value $I_{MAX}$ 1952, in the same way as discussed above.

The circuit 1900 further includes a clamp-circuit 1974, which is configured to set the control-voltage $V_C$ 1956 to a clamp-voltage-value when the current-limiter 1950 provides the current-control-signal $I_{CONTROL}$ having the limited value of the max-current-control-value $I_{MAX}$ 1952. Optional feedback from the current-limiter 1950 to the clamp-circuit 1974 is shown schematically as a dashed line in FIG. 19. The clamp-circuit 1974 can directly or indirectly set the control-voltage $V_C$ 1956 the clamp-voltage-value; for example by affecting/controlling one or more components in the output voltage control loop, as will be described in more detail below.

The clamp-circuit 1974 can advantageously enable the circuit 1900 to quickly return to a normal operating mode after a heavy load current step in which the current-control-signal $I_{CONTROL}$ 1918 is limited. This can reduce the drift of the control-voltage $V_C$ 1956 (especially when the controller 1936 includes an integrator). Therefore, the voltage overshoot in the output-voltage $V_{OUT}$ of the SMPS 1901 can be reduced. In some examples, the overshoot in the output-voltage $V_{OUT}$ in the case of a recovery after a current limiting situation is not higher than recovery in the case without current limiting.

The clamp-voltage-value may be the value of the control-voltage $V_C$ 1956 when current limiting begins. In this way, if the max-current-control-value $I_{MAX}$ 1952 is adjustable, then advantageously the associated clamp level can also automatically vary with this setting. Alternatively, the clamp-voltage-value may be a predetermined value that enables the controller 1936 to adequately return to a normal operating mode after current limiting has stopped. If a constant, predetermined value is used, then in some applications it should be set at a level that corresponds to the level for the highest possible setting for the max-current-control-value $I_{MAX}$ 1952. In this way, the clamp-voltage-value should not limit the range for the adjustable maximum current $I_{MAX}$ 1952.

The control-voltage VC 1956 may be:
(i) based on the difference between (a) the sense-voltage $V_{SH}$ 1938, and (b) the reference-voltage $V_{REF}$ 1942, when the resultant control-voltage $V_C$ 1956 would produce a target-current-control-signal $I_{TARGET}$ 1954 that is less than or equal to the max-current-control-value $I_{MAX}$ 1952; and
(ii) fixed as the clamp-voltage-value when: the difference between (a) the sense-voltage $V_{SH}$ 1938, and (b) the reference-voltage $V_{REF}$ 1942 would produce a target-current-control-signal $I_{TARGET}$ 1954 that is greater than the max-current-control-value $I_{MAX}$ 1952.

The example of the controller 1936 shown in FIG. 19 includes two sub-processing blocks 1943, 1944. The first sub-processing block 1343 processes the sense-voltage $V_{SH}$ 1938 and the reference-voltage $V_{REF}$ 1942, in order to provide the control-voltage $V_C$ 1956. The second sub-processing block 1944 processes the control-voltage $V_C$ 1956, in order to generate the target-current-control-signal $I_{TARGET}$ 1954. One or both of the sub-processing blocks 1943, 1944 may be implemented as transconductance-amplifier-control-blocks.

Figure 20:
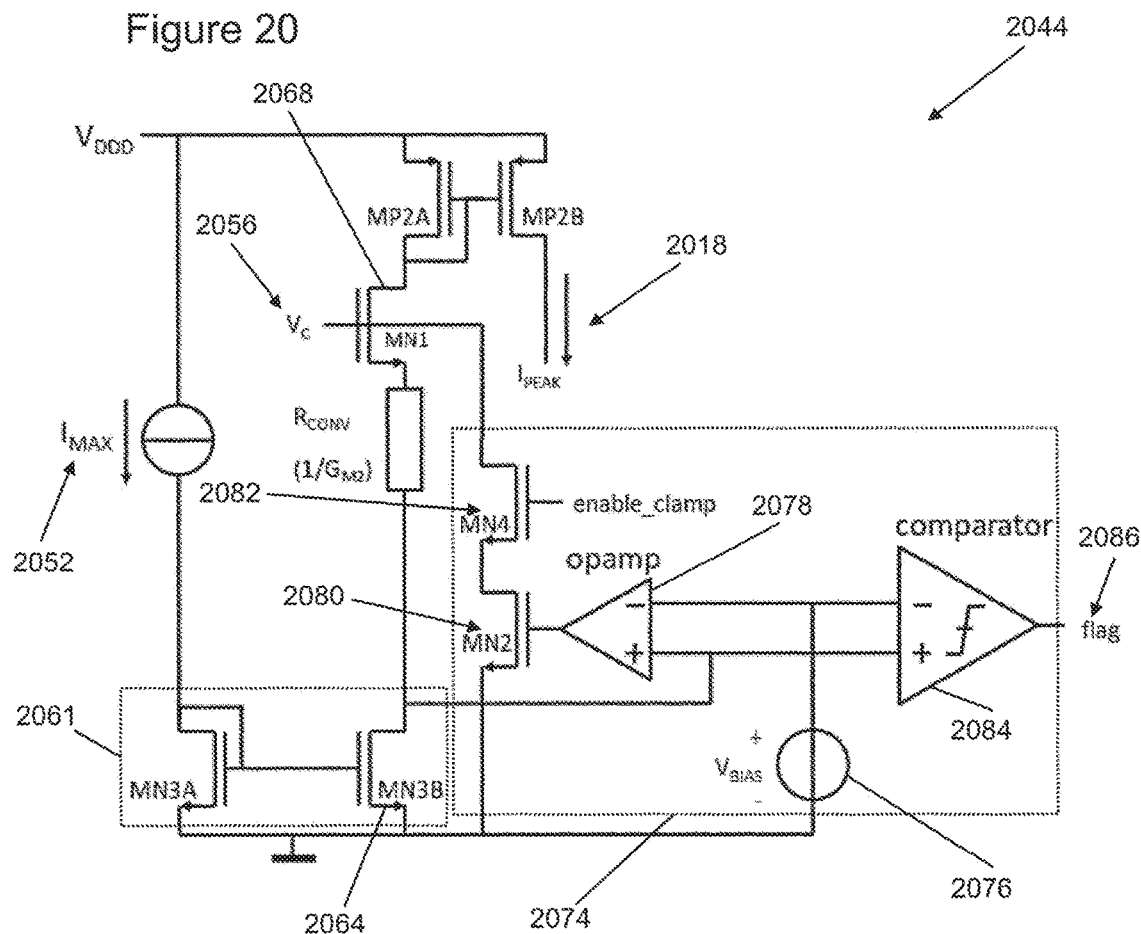
FIG. 20 shows an example embodiment of a transconductance-amplifier-control-block that provides the functionality of the second sub-processing block, the current-limiter, and the clamp-circuit of FIG. 19.

FIG. 20 shows an example embodiment of a transconductance-amplifier-control-block 2044 that provides the functionality of the second sub-processing block, the current-limiter, and the clamp-circuit of FIG. 19. In this example, the current-control-signal $I_{CONTROL}$ of FIG. 19 is implemented as a peak-current-control-signal $I_{PEAK}$ 2018

The transconductance-amplifier-control-block 2044 is configured to receive the control-voltage $V_C$ 2056; prevent the control-voltage $V_C$ 2056 from increasing when the peak-current-control-signal $I_{PEAK}$ 2018 has the limited value of the max-current-control-value $I_{MAX}$ 2052; and convert the control-voltage $V_C$ 2056 to the peak-current-control-signal $I_{PEAK}$.

Components of FIG. 20 that have already been described with reference to FIG. 14 have been given corresponding reference numbers in the 2000 series, and will not necessarily be described again here.

The clamp-circuit 2074 includes: a bias-voltage-source 2076; a voltage amplifier, which in this example is an opamp 2078; and a clamp-transistor MN2 2080. In this example, the clamp-circuit 2074 also includes an optional clamp-switch MN4 2082 that can be used to selectively enable or disable the functionality of the clamp-circuit 2074.

The clamp-circuit 2074 can be considered as a voltage regulator, in that it can regulate the control-voltage $V_C$ to the clamp-voltage-value, for all values $V_{SH}$ and $V_{REF}$ that would cause $I_{TARGET}$ to be set to a value that is equal to or greater than the max-current-control-value $I_{MAX}$ 2052. That is, once the control-voltage $V_C$ (received from a preceding component in the controller) reaches a value where current limiting starts, any subsequent increases to the control-voltage $V_C$, that would be expected due to a mismatch between $V_{SH}$ and $V_{REF}$, do not occur because the control-voltage $V_C$ is regulated by the clamp-circuit 2074. In this way, the SMPS is not further controlled in an attempt to reduce the difference between $V_{SH}$ and $V_{REF}$. This is because the difference between $V_{SH}$ and $V_{REF}$ cannot be further reduced due to the current limiting that is performed by the current-limiter.

The opamp 2078 has a first-opamp-input-terminal and a second-opamp-input-terminal. The first-opamp-input-terminal receives a bias-voltage-signal $V_{BIAS}$ from the bias-voltage-source 2076. The bias-voltage-signal $V_{BIAS}$ may also be referred to as a saturation voltage because it is used to determine whether or not a transistor has entered a saturation region, as will be discussed below. The second-opamp-input-terminal receives a current-limited-indicator-signal. The current-limited-indicator-signal is indicative of whether or not the peak-current-control-signal $I_{PEAK}$ 2018 is set to the max-current-control-value $I_{MAX}$ 2052. The opamp has an opamp-output-terminal that is connected to a control terminal of the clamp-transistor MN2 2080. The conduction channel or the clamp-transistor MN2 2080 is connected in series between the control terminal of the input-transistor MN1 2068 and ground.

In this example, the second-opamp-input-terminal is connected to the drain of the first-mirror-second-transistor MN3B 2064. As discussed above with reference to FIG. 14, when the peak-current-control-signal $I_{PEAK}$ 2018 is set to the max-current-control-value $I_{MAX}$ 2052, the first-mirror-second-transistor MN3B 2064 goes into a saturation region. When the first-mirror-second-transistor MN3B 2064 is in the saturate region, the voltage at its drain increases, thereby increasing the voltage at the second-opamp-input-terminal. The bias-voltage-signal $V_{BIAS}$ can have a value that corresponds to the drain-source saturation voltage of the first-mirror-second-transistor MN3B 2064 ($V_{DS,SAT,MN3B}$). When the voltage at the second-opamp-input-terminal exceeds the bias-voltage-signal $V_{BIAS}$ that is received at the first-opamp-input-terminal, the opamp 2078 controls the clamp-transistor 2080 such that the control-voltage $V_C$ at the control terminal of the clamp-transistor MN2 2080 is clamped at the clamp-voltage-value. This therefore causes the peak-current-control-signal to have a value of $I_{MAX}$.

In this way, the clamp-circuit 2074 can detect when current limiting is being performed by comparing the drain voltage of the first-mirror-second-transistor MN3B 2064 with a bias-voltage that is equal to $V_{DS,SAT,MN3B}$. Then, as soon as current limiting occurs, the drain voltage of the first-mirror-second-transistor MN3B 2064 will exceed $V_{BIAS}$, and the opamp 2078 in combination with the clamp-transistor MN2 2080 can regulate the voltage drop across the first-mirror-second-transistor MN3B 2064 to the saturation-voltage provided by the bias-voltage-source 2076. That is, the clamp-circuit 2074 can prevent the control-voltage $V_C$ 2056 from increasing when a transistor (such as the first-mirror-second-transistor MN3B 2084) is in saturation. In some examples, saturation can be identified by the voltage drop across the transistor exceeding a saturation-voltage of the transistor.

In this example, the clamp-circuit 2074 is configured to provide a flag-signal 2086 that is representative of whether or not the control-voltage $V_C$ is set to the clamp-voltage-value (which in this example is the last value of the control-voltage $V_C$ before current limiting started). To this end, the clamp-circuit 2074 includes a clamp-comparator 2084 that compares the bias-voltage-signal $V_{BIAS}$ with the current-limited-indicator-signal and sets the flag-signal 2086 to a value that is representative of clamping when the current-limited-indicator-signal is greater than the bias-voltage-signal $V_{BIAS}$.

In some applications, the clamp-circuit 2074 can pass the flag-signal 2086 to a controllable-block that if configured to be automatically controlled based on the flag-signal 2086. For instance, an audio amplifier circuit may include a controllable-block that is configured to be automatically controlled based on the flag-signal 2086. The controllable-block may comprise an amplifier, and the amplifier can automatically control an audio level of an output signal of the audio amplifier circuit based on the flag-signal. The audio amplifier may be a class-D audio amplifier. For example, the amplifier can automatically reduce an audio level of the output signal of the audio amplifier circuit when the flag-signal 2086 indicates that the control-voltage $V_C$ is clamped. This can be on the basis that voltage clamping occurs when the volume is too high and can be damaging to the ears of listeners and/or in order to avoid excessive power consumption and/or to avoid high distortion of the audio signal when the supply voltage for the amplifier $V_{BST}$ is not high enough when clamping occurs.

In some examples, a cascode (not shown) can be provided in series with the first current mirror 2061 in order to advantageously increase the accuracy of the first current mirror 2061.

FIGS. 21 to 24 show plots of signals for the circuit of FIG. 19, where the SMPS is implemented as a boost converter in the same way as FIG. 13.

Figure 21:
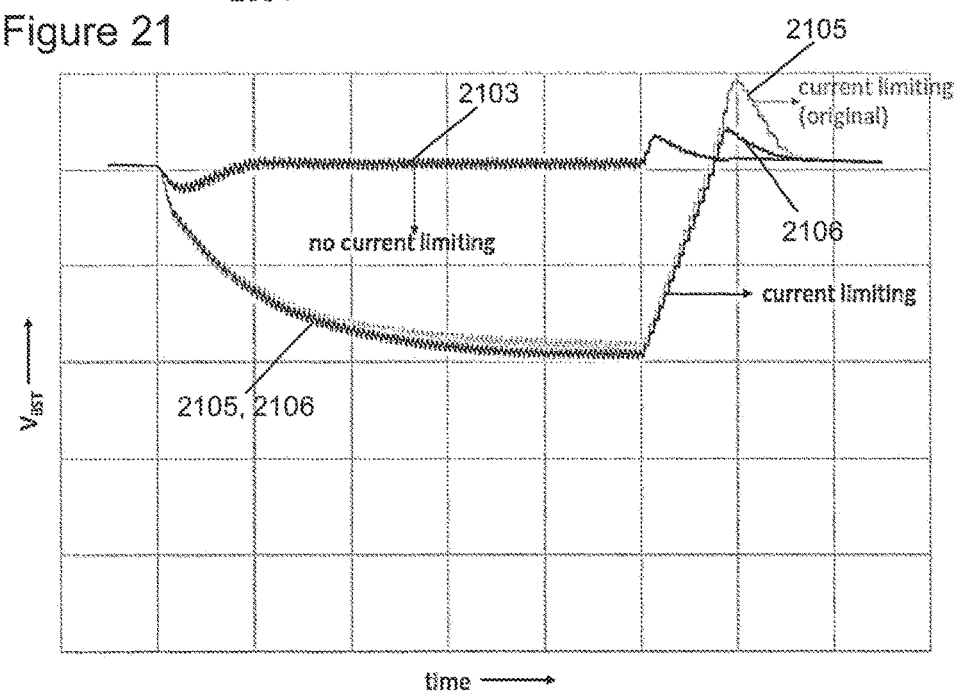
FIG. 21 shows three plots of output-voltage $V_{BST}$ versus time, including a plot for the circuit of FIG. 19/20.

FIG. 21 shows three plots of output-voltage $V_{BST}$ versus time;
  a first plot 2103 that corresponds to a load step-up and step-down that does not result in current limiting;
  a second plot 2105 that corresponds to a load step-up and step-down for the circuit of FIG. 13, that is a load step that does result in current limiting but is for a circuit that does not have voltage clamping; and
  a third plot 2106 that corresponds to a load step-up and step-down for the circuit of FIG. 19, that is a load step that does result in current limiting and is for a circuit that does have voltage clamping.

A comparison of the second and third plots 2105, 2106 shows that use of the control-voltage clamping advantageously reduces the overshoot in the output-voltage $V_{BST}$.

Figure 22:
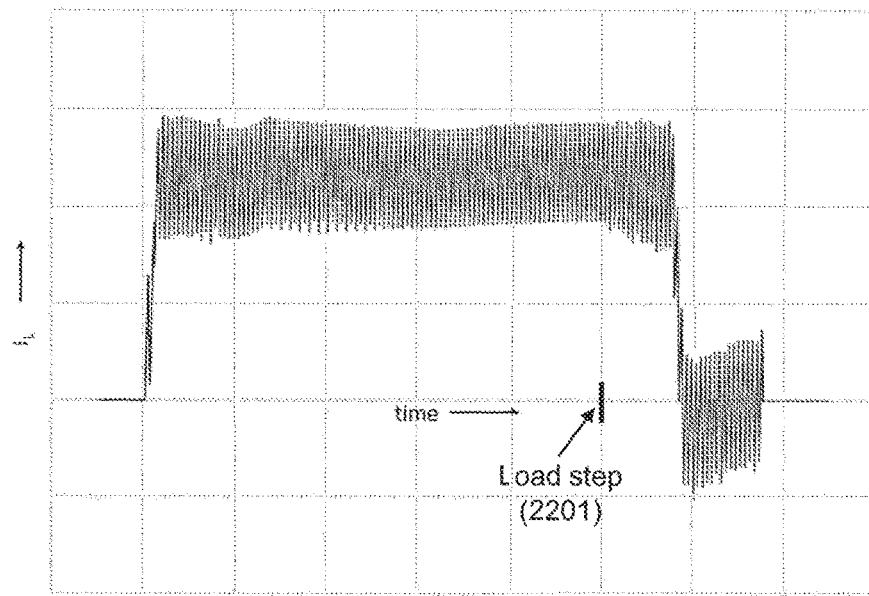
FIG. 22 shows the inductor current $I_L$ during a load step-up and step-down, including a plot for the circuit of FIG. 19/20.

FIG. 22 shows the inductor current $I_L$ during a load step-up and step-down, where both current limiting and voltage clamping are used.

Figure 23:
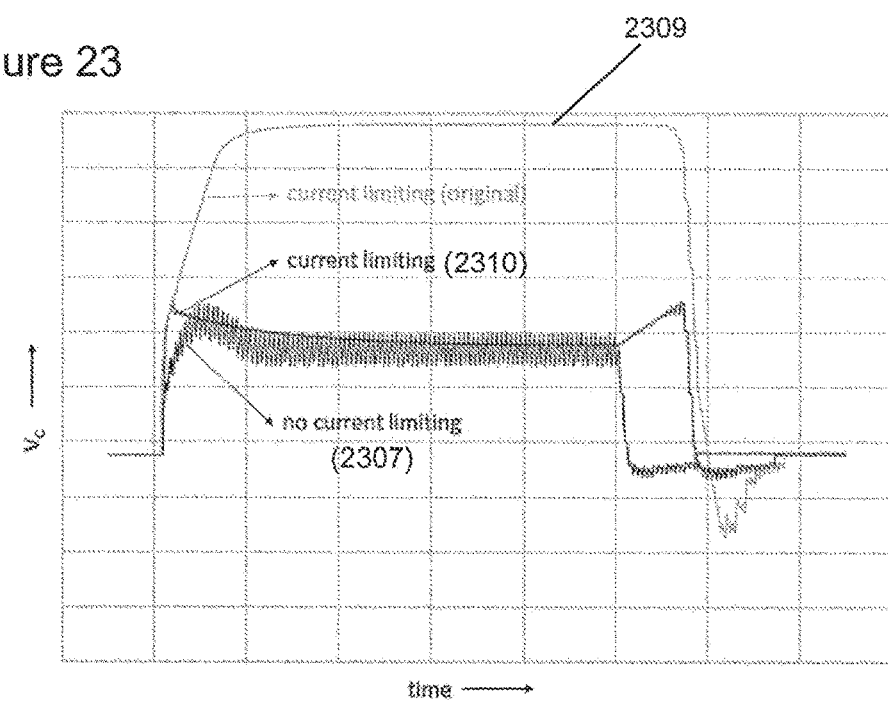
FIG. 23 shows three plots of the control-voltage $V_C$ versus time, including a plot for the circuit of FIG. 19/20.

FIG. 23 shows three plots of the control-voltage $V_C$ versus time;
  a first plot 2307 that correspond to a load step-up and step-down that does not result in current limiting; and
  a second plot 2309 that corresponds to a load step-up and step-down for the circuit of FIG. 13, that is a load step that does result in current limiting but is for a circuit that does not have voltage clamping; and
  a third plot 2310 that corresponds to a load step-up and step-down for the circuit of FIG. 19, that is a load step that does result in current limiting and is for a circuit that does have voltage clamping.

FIG. 23 shows that the control-voltage $V_C$ does not significantly drift away from its normal operation value while the current is being limited.

Figure 24:
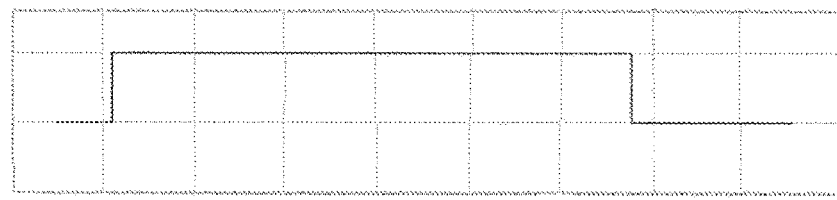
FIG. 24 shows a plot of the flag-signal of FIG. 20.

FIG. 24 shows a plot of the flag-signal that is representative of whether or not the control-voltage $V_C$ is set to the clamp-voltage-value.

Figure 25:
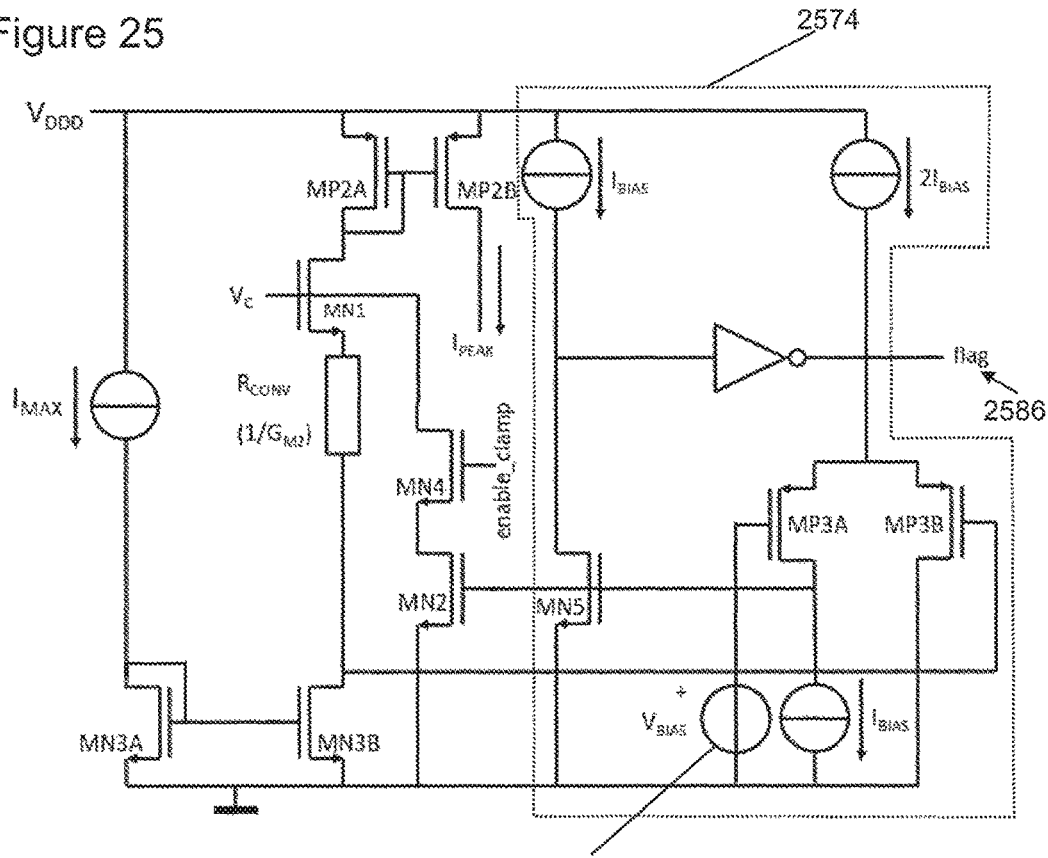
FIG. 25 shows an example embodiment of the transconductance-amplifier-control-block of FIG. 20, which provides the functionality of the second sub-processing block, the current-limiter, and the clamp-circuit of FIG. 10.

FIG. 25 shows an example embodiment of the transconductance-amplifier-control-block of FIG. 20, which provides the functionality of the second sub-processing block, the current-limiter, and the clamp-circuit of FIG. 19. In particular, further details of the clamp-circuit 2574 are included in FIG. 25. The opamp of FIG. 20 is constructed with a differential matched pair (MP3A and MP3B) and two bias current sources. The comparator in FIG. 20, which generates the flag-signal 2586, is built with: a transistor MN5, a bias current source and an inverter.

FIG. 25 also shows the bias-voltage-source 2576 of FIG. 20.

Figure 26:
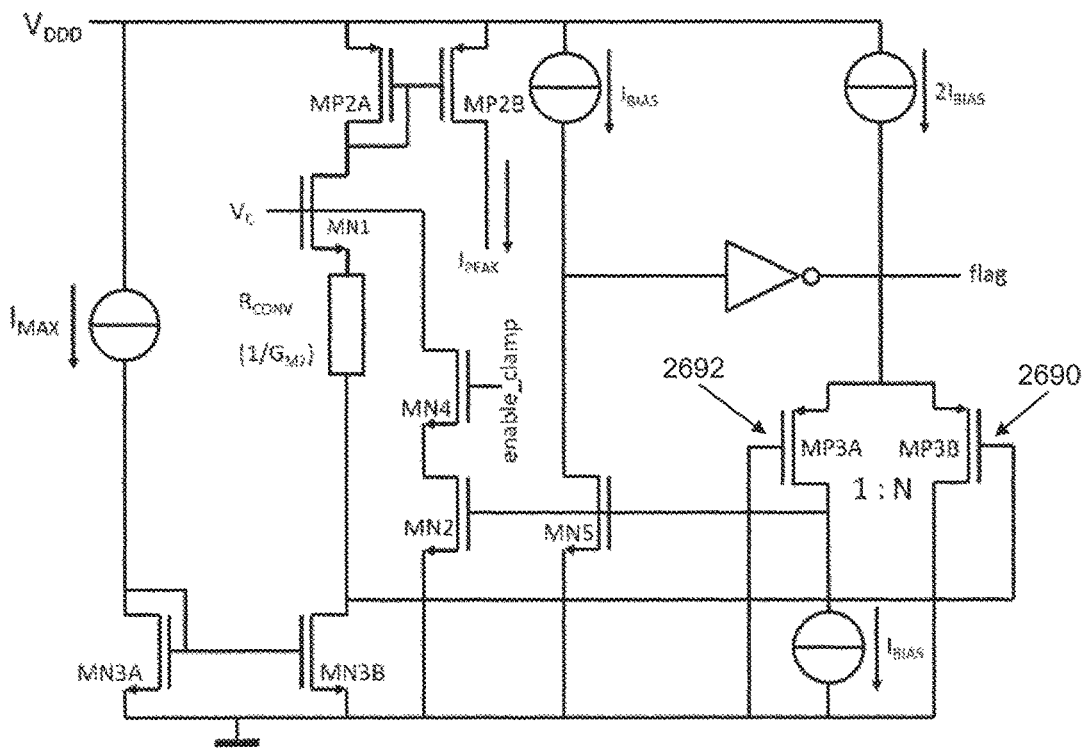
FIG. 26 shows an example embodiment of a transconductance-amplifier-control-block, which is similar to that of FIG. 25.

FIG. 26 shows an example embodiment of a transconductance-amplifier-control-block, which is similar to that of FIG. 25. In FIG. 26, the functionality of the voltage source $V_{BIAS}$ of FIG. 25 has been replaced by a systematic offset on the input of the opamp by choosing different sizes of the input-transistors MP3A 2692 and MP3B 2690.

Figure 27:
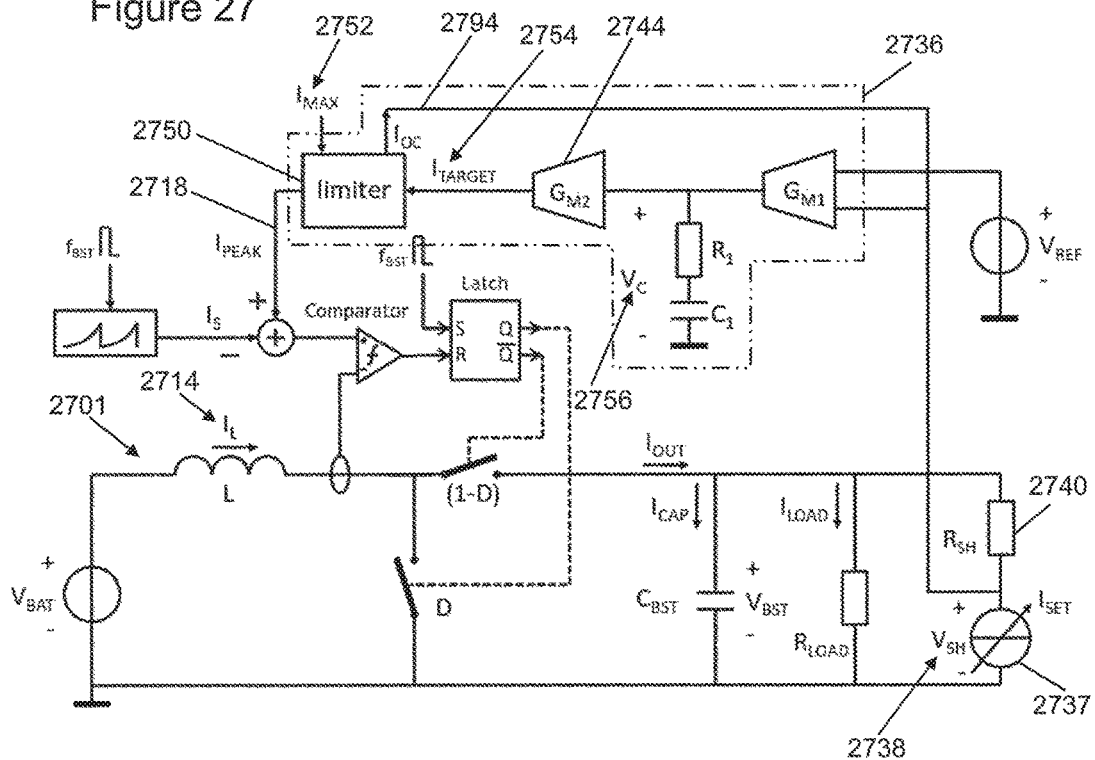
FIG. 27 shows another example embodiment of a circuit that includes a SMPS and a controller.

FIG. 27 shows another example embodiment of a circuit 2700 that includes a SMPS 2701 and a controller 2736. In this example, the SMPS 2701 is a boost converter. Features of FIG. 27 that are shown in either of FIG. 13 or 19 have been given corresponding reference numbers in the 2700 series, and will not necessarily be described again here.

The controller 2736 incorporates the functionality of a current-limiter 2750 in the same way as discussed above. The controller 2736 also incorporates the functionality of a clamp-circuit, although in this example the clamp-circuit indirectly sets the control-voltage $V_C$ 2756 to a clamp-voltage-value. As will be discussed in more detail with reference to FIG. 28, the controller 2736 can provide a non-zero over-current-signal $I_{OC}$ 2794 when the current-control-signal $I_{PEAK}$ 2718 has the limited value of $I_{MAX}$ 2752. The over-current-signal be $I_{OC}$ 2794 is configured to increase $V_{SH}$ independently of the current through the boost converter 2701, thereby effectively lowering the set-point for the boost voltage to a different level that is low enough to maintain the load current with $I_{PEAK}=I_{MAX}$.

The boost converter 2701 includes: a sense-resistor $R_{SH}$ 2740, which is configured to provide the sense-voltage $V_{SH}$ 2738 to the controller 2736; and a programmable current source 2737 which provides a current $I_{SET}$ through the sense-resistor $R_{SH}$ 2740. In this example, because the overcurrent-signal $I_{OC}$ 2794 is also provided to the sense-resistor $R_{SH}$ 2740, the sense-voltage $V_{SH}$ 2738 is equal to:

$$V_{SH} = V_{BST} - R_{SH}(I_{SET} - I_{OCP}), \text{ where}$$

$$I_{SET} = \frac{(V_{BST,TARGET} - V_{REF})}{R_{SH}} \text{ and consequently,}$$

$$V_{SH} = V_{BST} - (V_{BST,TARGET} - R_{SH}I_{OCP}) + V_{REP}$$

Therefore, a non-zero, positive, value for the over-current-signal $I_{OC}$ 2794 effectively decreases $V_{BST,TARGET}$ with $R_{SH}*I_{OCP}$ which causes $V_{BST}$ 2738 to decrease while keeping $V_{SH}$ constant and also keeping the error voltage $V_{REF}-V_{SH}$ constant. $V_{BST,TARGET}$ can be referred to as a target-output-voltage.

In FIG. 27, the voltage across the sense resistor $R_{SH}$ 2740 is clamped using the over-current-signal $I_{OC}$ 2794. This has the knock-on effect of (indirectly) clamping the control-voltage $V_C$ 2766. Under normal operating conditions, when the target-current-control-signal $I_{TARGET}$ 1954 is below the maximum current level and therefore is not being limited, the over-current-signal $I_{OC}$ 2794 is zero. However, when current limiting occurs, the over-current-signal $I_{OC}$ 2794 will increase to limit the voltage across the sense resistor $R_{SH}$ 2740. The net effect is that the target boost voltage $V_{BST,TARGET}$ is reduced with $R_{SH}*I_{OCP}$. Instead of regulating the boost voltage using the inductor current $I_L$ 2714 as is done under normal operating conditions, now the inductor current $I_L$ 2714 is regulated to the maximum level using the boost voltage. Since the loop provided by the controller 2736 is still in control, the error voltage will be small and the control-voltage (integrated error voltage) $V_C$ 2756 will not drift away.

In the same way as FIG. 19, the controller 2736 of FIG. 27 includes a second sub-processing block 2744 that processes the control-voltage $V_C$ 2756 in order to generate the target-current-control-signal $I_{TARGET}$ 2754.

Figure 28:
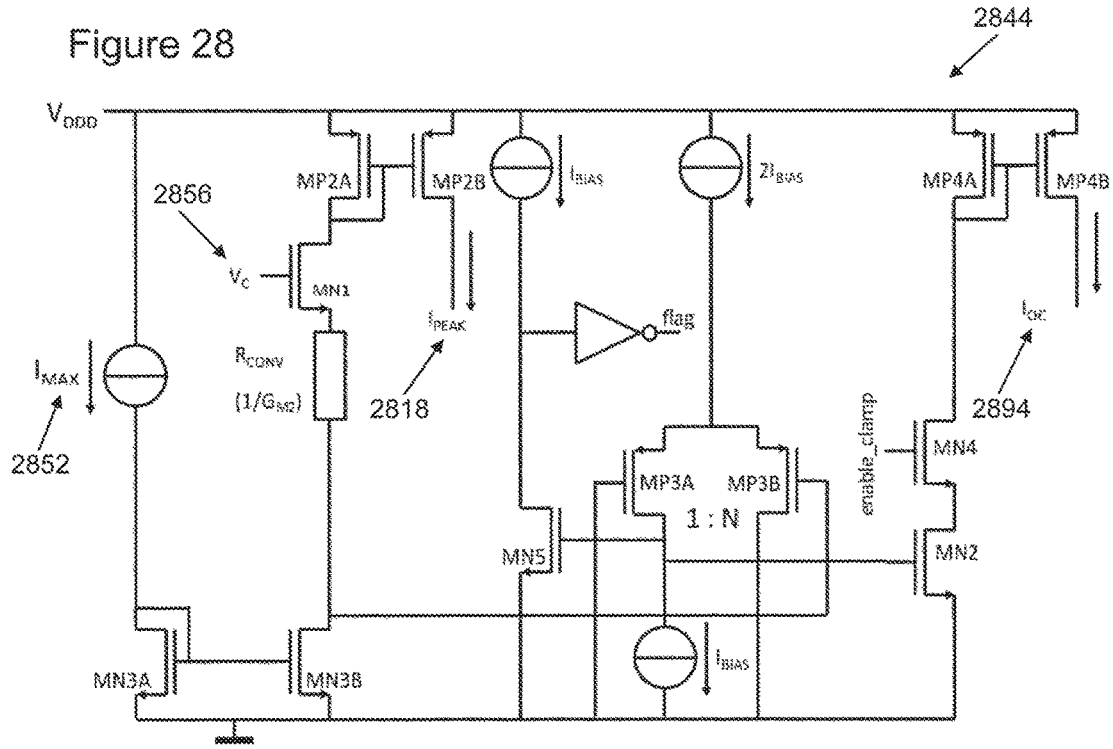
FIG. 28 shows an example implementation of the second sub-processing block of FIG. 27.

FIG. 28 shows an example implementation of the second sub-processing block of FIG. 27, which to this example is a transconductance-amplifier-control-block 2844. Features of the transconductance-amplifier-control-block 2844 that have already been described with reference to FIG. 14, 20, 25 or 26 will not necessarily be described again here.

The transconductance-amplified-control-block 2844 incorporates the functionality of the current-limiter and the clamp-circuit such that the transconductance-amplifier-control-block 2844 is configured to: receive the control-voltage $V_C$ 2856, and provide a non-zero over-current-signal $I_{OC}$ 2894 when the current-control-signal $I_{PEAK}$ 2518 has the limited value of $I_{MAX}$ 2852. As discussed above, the over-current-signal $I_{OC}$ 2894 is configured to change the boost voltage $V_{BST,TARGET}$ independently of the current through the switched-mode-power-supply. The transconductance-amplifier-control-block 2844 also converts the control-voltage $V_C$ 2856 to the current-control-signal $I_{PEAK}$ 2818.

One or more of the examples disclosed herein can be used with any current mode controlled DC-DC converter, and especially those with an integrating voltage control loop.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded (or execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium of media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A circuit for a switched-mode-power-supply, wherein the switched-mode-power-supply is configured to: receive a current-control-signal; and provide an output-voltage based on the current-control-signal, the circuit comprising:
   a controller, configured to:
      generate a control-voltage based on a difference between: (i) a sense-voltage, which is representative of the output-voltage of the switched-mode-power-supply; and (ii) a reference-voltage;

generate a target-current-control-signal based on the control-voltage, wherein the target-current-control-signal is configured to adjust a current through the switched-mode-power-supply in order to bring a magnitude of the sense-voltage closer to a magnitude of the reference-voltage;

a current-limiter configured to provide the current-control-signal as the target-current-control-signal limited to a max-current-control-value; and a clamp-circuit configured to set the control-voltage to a clamp-voltage-value when the current-limiter provides the current-control-signal having the limited value of the max-current-control-value;

wherein the controller includes a transconductance-amplifier-control-block, which incorporates a functionality of the current-limiter and the clamp-circuit such that the transconductance-amplifier-control-block is configured to:

receive the control-voltage;

prevent the control-voltage from increasing when the current-control-signal has the limited value of the max-current-control-value; and convert the control-voltage to the current-control-signal.

2. The circuit of claim 1,
wherein the clamp-circuit comprises a voltage regulator,
wherein the voltage regulator is configured to regulate the control-voltage to the clamp-voltage-value for all values of the sense-voltage and the reference-voltage that would cause the target-current-control-signal to be set to a value that is equal to or greater than the max-current-control-value.

3. The circuit of claim 1, wherein the transconductance-amplifier-control-block comprises:
a voltage amplifier,
a bias-voltage-source configured to provide a saturation-voltage;
a clamp-transistor; and
a first-mirror-second-transistor;
wherein the voltage amplifier in combination with the clamp-transistor is configured to regulate the voltage drop across the first-mirror-second-transistor to the saturation-voltage provided by the bias-voltage-source.

4. The circuit of claim 1, wherein:
the transconductance-amplifier-control-block comprises an additional transistor, and
the transconductance-amplifier-control-block is configured to prevent the control-voltage from increasing when the voltage drop across the transistor exceeds a saturation-voltage of the transistor.

5. The circuit of claim 3,
wherein the saturation-voltage is representative of the additional transistor being in a saturated state of operation.

6. The circuit of claim 1,
wherein the transconductance-amplifier-control-block is configured prevent the control-voltage from increasing when a transistor in the transconductance-amplifier-control-block is in saturation.

7. The circuit of claim 1, wherein the controller comprises:
the transconductance-amplifier-control-block, which incorporates the functionality of the current-limiter and the clamp-circuit such that the transconductance-amplifier-control-block is configured to:

receive the control-voltage;
provide a non-zero over-current-signal when the current-control-signal has the limited value of max-current-control-value,
wherein the over-current-signal is configured to change the sense-voltage independently of the current through the switched-mode-power-supply; and
convert the control-voltage to the current-control-signal.

8. The circuit of claim 1,
wherein the clamp-voltage-value is a value of the control-voltage before the current-limiter provides the current-control-signal with the limited value of the max-current-control-value.

9. The circuit of claim 8,
wherein the clamp-circuit is configured to clamp the control-voltage to a current value when the current-limiter provides the current-control-signal with the limited value of the max-current-control-value.

10. The circuit of claim 1,
wherein the controller is configured to generate the control-voltage by integrating the difference between: (i) the sense-voltage; and (ii) the reference-voltage.

11. The circuit of claim 1,
wherein the target-current-control-signal is configured to adjust the current through the switched-mode-power-supply by setting the peak current through an inductor in the switched-mode-power-supply.

12. The circuit of claim 1, wherein:
the clamp-circuit is configured to provide a flag-signal that is representative of whether or not the control-voltage is set to the clamp-voltage-value; and
the circuit comprises a controllable-block that is configured to be automatically controlled based on the flag-signal.

13. An audio amplifier circuit comprising:
the circuit of claim 1,
wherein the clamp-circuit is configured to provide a flag-signal that is representative of whether or not the control-voltage is set to the clamp-voltage-value; and
a controllable-block that is configured to be automatically controlled based on the flag-signal.

14. The audio amplifier circuit of claim 13,
wherein the controllable-block comprises an amplifier, and wherein the amplifier is configured to automatically control an audio level of an output signal of the audio amplifier circuit based on the flag-signal.

15. A circuit for a switched-mode-power-supply, wherein the switched-mode-power-supply is configured to: receive a current-control-signal; and provide an output-voltage based on the current-control-signal, the circuit comprising:
a controller, configured to:
generate a control-voltage based on a difference between: (i) a sense-voltage, which is representative of the output-voltage of the switched-mode-power-supply; and (ii) a reference-voltage;
generate a target-current-control-signal based on the control-voltage, wherein the target-current-control-signal is configured to adjust a current through the switched-mode-power-supply in order to bring a magnitude of the sense-voltage closer to a magnitude of the reference-voltage;
a current-limiter configured to provide the current-control-signal as the target-current-control-signal limited to a max-current-control-value; and
a clamp-circuit configured to set the control-voltage to a clamp-voltage-value when the current-limiter provides the current-control-signal having the limited value of the max-current-control-value;

wherein the controller includes a transconductance-amplifier-control-block, which incorporates a functionality of the current-limiter and the clamp-circuit such that the transconductance-amplifier-control-block is configured to:

receive the control-voltage;

provide a non-zero over-current-signal when the current-control-signal has the limited value of max-current-control-value, wherein the over-current-signal is configured to change the sense-voltage independently of the current through the switched-mode-power-supply; and convert the control-voltage to the current-control-signal.

16. A circuit for a switched-mode-power-supply, wherein the switched-mode-power-supply is configured to: receive a current-control-signal; and provide an output-voltage based on the current-control-signal, the circuit comprising:

a controller, configured to:

generate a control-voltage based on a difference between: (i) a sense-voltage, which is representative of the output-voltage of the switched-mode-power-supply; and (ii) a reference-voltage;

generate a target-current-control-signal based on the control-voltage, wherein the target-current-control-signal is configured to adjust a current through the switched-mode-power-supply in order to bring a magnitude of the sense-voltage closer to a magnitude of the reference-voltage;

a current-limiter configured to provide the current-control-signal as the target-current-control-signal limited to a max-current-control-value; and a clamp-circuit configured to set the control-voltage to a clamp-voltage-value when the current-limiter provides the current-control-signal having the limited value of the max-current-control-value;

wherein the circuit in included in an audio amplifier circuit;

wherein the clamp-circuit is configured to provide a flag-signal that is representative of whether or not the control-voltage is set to the clamp-voltage-value; and a controllable-block that is configured to be automatically controlled based on the flag-signal;

wherein the controllable-block comprises an amplifier, and wherein the amplifier is configured to automatically control an audio level of an output signal of the audio amplifier circuit based on the flag-signal.

* * * * *